US005121091A

United States Patent [19]

Fujiyama

[11] Patent Number: 5,121,091

[45] Date of Patent: Jun. 9, 1992

[54] PANEL SWITCH

[75] Inventor: Terumi Fujiyama, Katano, Japan

[73] Assignee: Matsushita Electric Industrial Co., Ltd., Osaka, Japan

[21] Appl. No.: 588,942

[22] Filed: Sep. 27, 1990

Related U.S. Application Data

[62] Division of Ser. No. 404,879, Sep. 8, 1989, Pat. No. 4,977,298.

[51] Int. Cl.[5] .................... H03K 17/94; H03M 11/00

[52] U.S. Cl. .................................... 335/1; 335/219; 335/209; 340/407; 341/27

[58] Field of Search .................... 340/407; 341/27, 21; 434/113, 114

[56] References Cited

U.S. PATENT DOCUMENTS

| | | | |
|---|---|---|---|
| Re. 28,365 | 3/1975 | Braue . | |
| 3,860,771 | 1/1975 | Lynn et al. . | |
| 3,909,564 | 9/1975 | Scheingold et al. | 200/5 E |
| 4,028,502 | 6/1977 | Moricca et al. | 340/407 |
| 4,066,851 | 1/1978 | White et al. . | |
| 4,071,718 | 1/1978 | Harden | 200/5 A |
| 4,078,257 | 3/1978 | Bagley | 340/407 |
| 4,291,201 | 9/1981 | Johnson et al. . | |
| 4,303,811 | 12/1981 | Parkinson | 200/5 A |
| 4,334,280 | 6/1982 | McDonald | 340/407 |
| 4,471,177 | 9/1984 | Doughty . | |
| 4,733,590 | 3/1988 | Watanabe . | |
| 4,767,943 | 8/1988 | Adler et al. . | |
| 4,771,139 | 9/1988 | DeSmet . | |
| 4,801,921 | 1/1989 | Zigenfus | 340/407 |
| 4,885,565 | 12/1989 | Embach | 340/407 |
| 4,977,298 | 12/1990 | Fujiyama . | |

FOREIGN PATENT DOCUMENTS

| | | |
|---|---|---|
| 56-132638 | 10/1981 | Japan . |
| 60-051838 | 4/1985 | Japan . |
| 61-052730 | 3/1986 | Japan . |

OTHER PUBLICATIONS

Berstis, V.; Key with Electrical tactile Feedback; Mar. 10, 1982.

*Primary Examiner*—Leo P. Picard
*Assistant Examiner*—Ramon M. Barrera
*Attorney, Agent, or Firm*—Stevens, Davis, Miller & Mosher

[57] ABSTRACT

A panel switch according to the present invention has a switching unit comprising a plurality of switches which are not provided with individual click mechanisms and at least one click mechanism for the switching unit. Because the switching unit does not incorporate individual click mechanisms, the panel switch can be formed into a small size. In addition, by the integration of the provided click mechanism, the degree of freedom on the design of the panel switch is enlarged, and a small-sized panel switch which is excellent in switching feeling can be offered.

26 Claims, 20 Drawing Sheets

PANEL SWITCH

This is a division of application Ser. No. 404,879, filed Sep. 8, 1989 now U.S. Pat. No. 4,977,298.

BACKGROUND OF THE INVENTION

1. Field of the Invention

The present invention relates to a panel switch useful for audiovisual equipment such as videotape recorders, other recorders and television monitors, office automation equipment such as facsimiles, telephones and duplicators, and an input tablet for a position detector.

2. Description of the Related Art

Recently, audiovisual (AV) equipment such as videotape recorders or television monitors, office automation (OA) equipment such as duplicators, facsimiles, telephones and personal computers, and electric home appliance such as cooking devices and washing machines have been rapidly reformed into a state equipped with electronic intelligent mechanism accompanied with the technological progress on micro computers or ICs. In this trend, panel switches which provide excellent switching feeling during data input are preferred as input devices for these equipment.

The prior art on these panel switches are explained in the following description with reference to the drawings, FIGS. 1–3.

FIGS. 1 and 2 illustrate a known panel switch. FIG. 1 is a perspective view of the panel switch in a disassembled state, while FIG. 2 is a side sectional view of the panel switch.

In FIG. 1, reference numeral 1 is a substrate board on which a flexible pattern circuit (hereinafter referred to as "FPC") is mounted. An insulating spacer 4 is mounted on the FPC 2 for insulating a pattern on the FPC 2 from diaphragms 3. Another spacer 5 for defining the position of the diaphragms 3 is further mounted on the insulating spacer 4. The diaphragms 3 are inserted into openings 6 of the spacer 5, and the FPC 2 is folded to cover the diaphragms 3. Knobs 7 are disposed on the folded FPC 2, and held with a casing 8. Thus, a panel switch with click mechanism is assembled.

With reference to FIG. 2, the operation of this panel switch is explained in the following.

By pushing down the knobs 7, the diaphragm 3 is reversed to provide click feeling, and a movable contact 9' comes in contact with a stationary contact 9 to make a short circuit therebetween for switching.

FIG. 3 is a sectional perspective view of a panel switch to be used as a known input tablet for a position detector.

This panel switch has the structure that a lower resistor 12 held with a lower FPC on a substrate board 10 is located at a position facing to an upper resistor 14 held with an upper FPC 13, a spacer 15 being held therebetween. In this panel switch, a switching position is detected from the resistances of these resistors 12, 14.

However, the known panel switch with a click mechanism afore-mentioned requires the diaphragms 3, to click feeling for every switch, which causes various problems as follows:

(1) The arrangement of the knobs 7 is restricted by the area of the diaphragms 3, so that the minimum pitches between the knobs 7 are limited to 7–8 mm in the known panel switch. Consequently, there are a lot of restrictions on the design of the panel switch, and it is impossible to form the panel switch into a small size.

(2) The same number of diaphragms 3 as that of the knobs 7 are required. In case of manufacturing a panel switch in which a lot of knobs are incorporated, the number of parts such as the diaphragms 3 as well as the numbers of manufacturing steps become large. As a result, the product becomes expensive.

(3) As for the input tablet for the position detector as afore-mentioned, it is impossible to incorporate an additional click mechanism in view of its structure. Therefore, it is difficult to confirm whether input operation is performed or not.

DISCLOSURE OF THE INVENTION

The present invention is aimed at solving the afore-mentioned problems.

According to the present invention, there is proposed a panel switch comprising a switching unit which does not have click mechanisms, and a moderating means which is actuated when one of switches in the switching unit is turned on. Since the click means is independently disposed without using a diaphragm for each of the switches, the panel switch can be formed into a small size, and optional moderate feeling can be adopted.

BEST MODE FOR CARRYING OUT THE INVENTION

An embodiment of the present invention will be described with reference to the accompanying drawings FIGS. 4-7.

Figure 1:
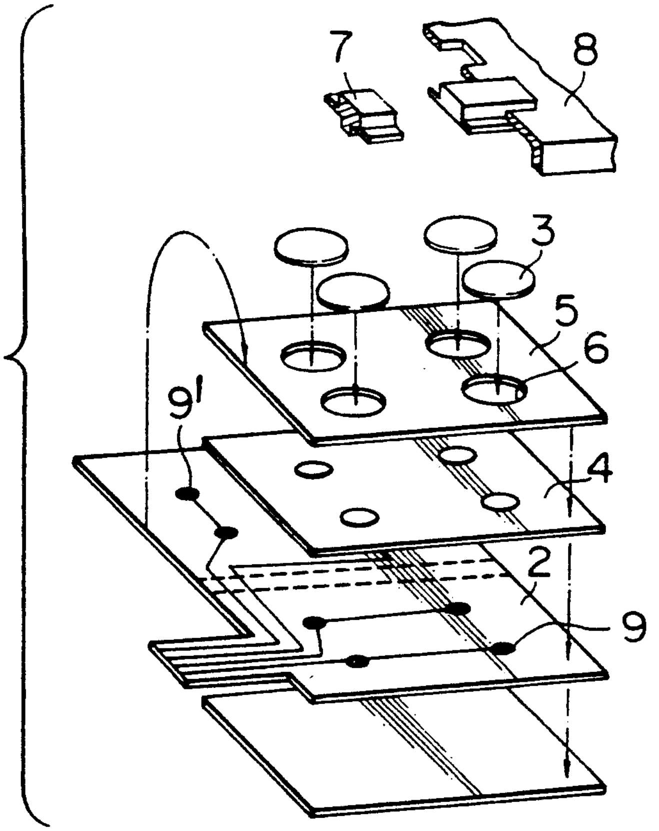
FIG. 1 PRIOR ART
FIG. 1 is a perspective view of a conventional panel switch in a disassembled state.
Figure 2:
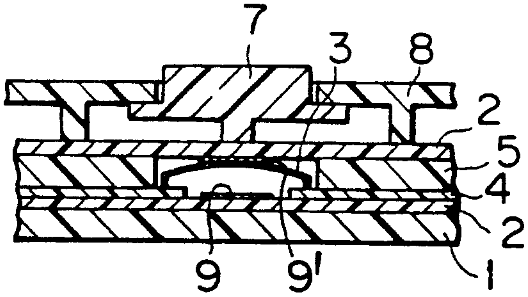
FIG. 2 PRIOR ART
FIG. 2 is a side sectional view of the panel switch shown in FIG. 1.
Figure 3:
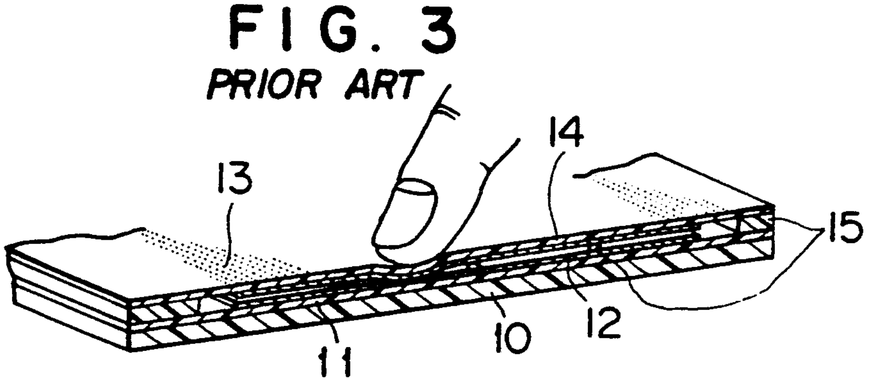
FIG. 3 PRIOR ART
FIG. 3 is a sectional perspective view of an input tablet for a position detector.
Figure 4:
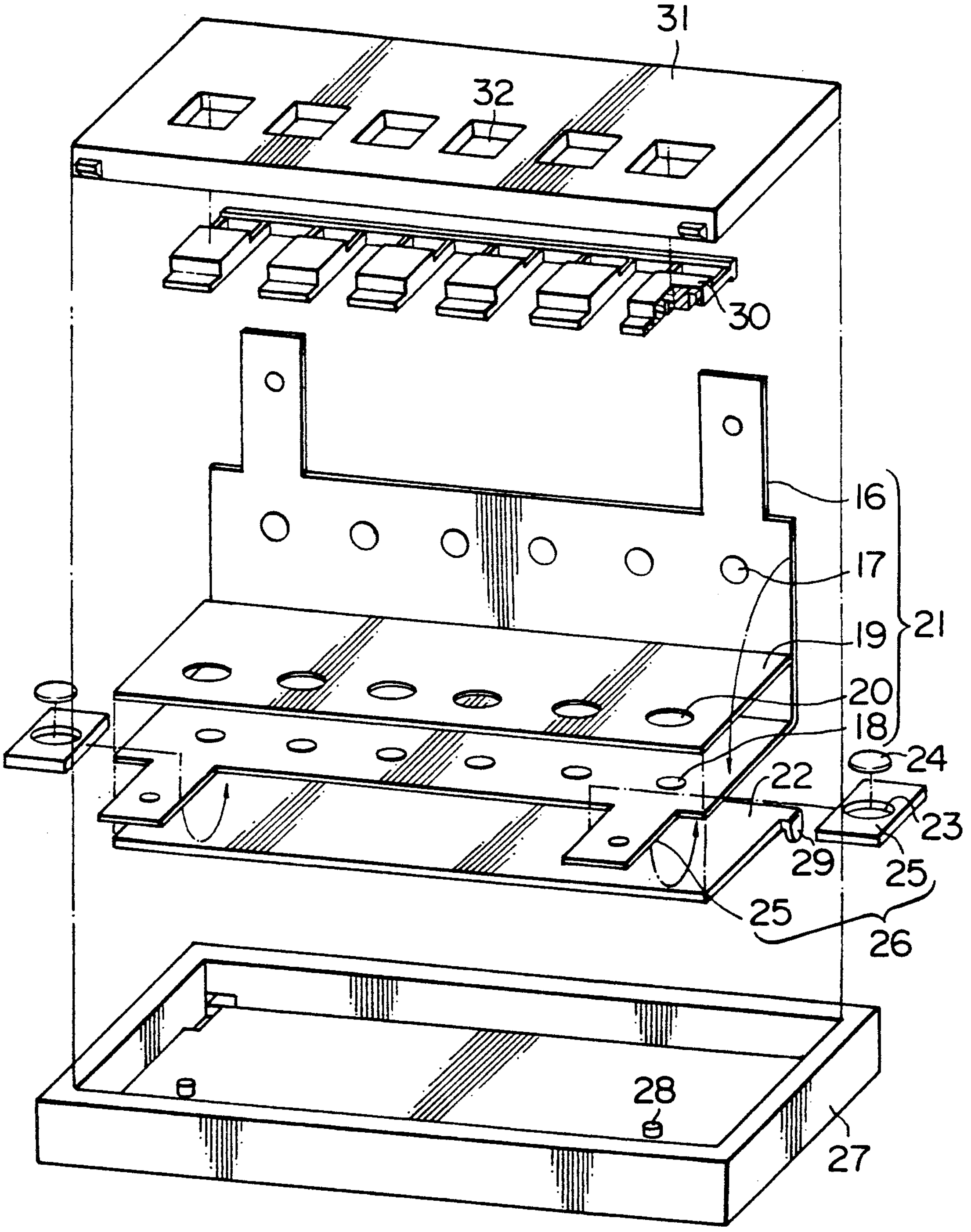
FIG. 4 is a perspective view of a panel switch in a preferred embodiment form in a disassembled state.
Figure 5A:
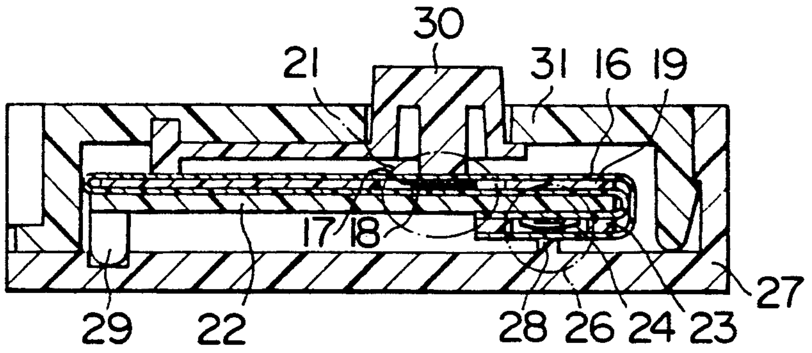
FIGS. 5*a*–5*c* are side sectional views showing the operating state of the panel switch shown in FIG. 4.
Figure 5B:
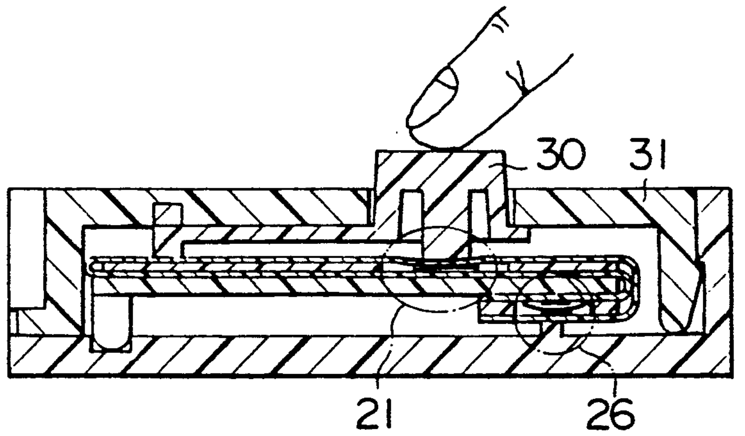
Figure 5C:
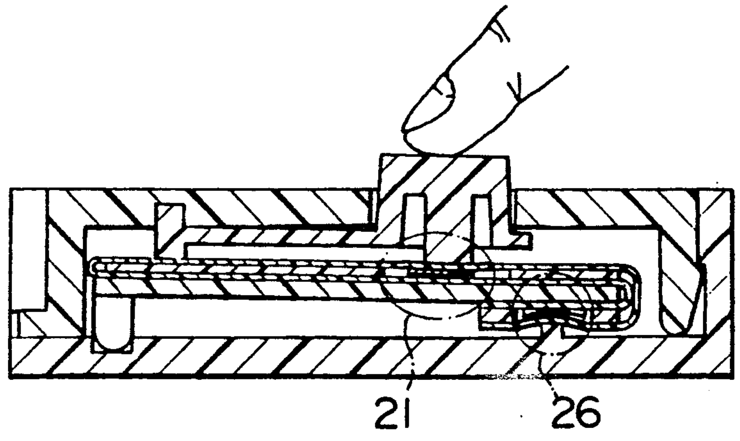
Figure 6:
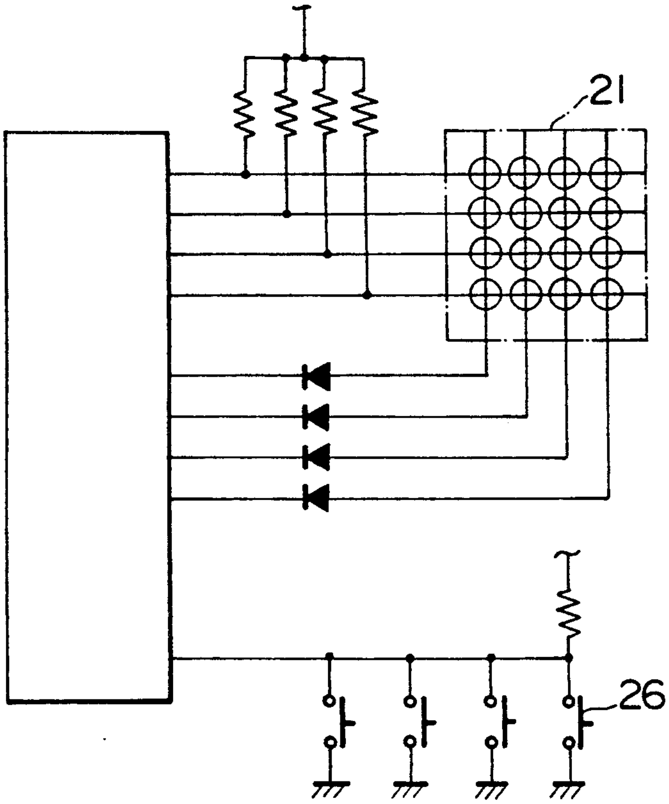
FIG. 6 is a block diagram of a circuit of key matrix as an example.
Figure 7:
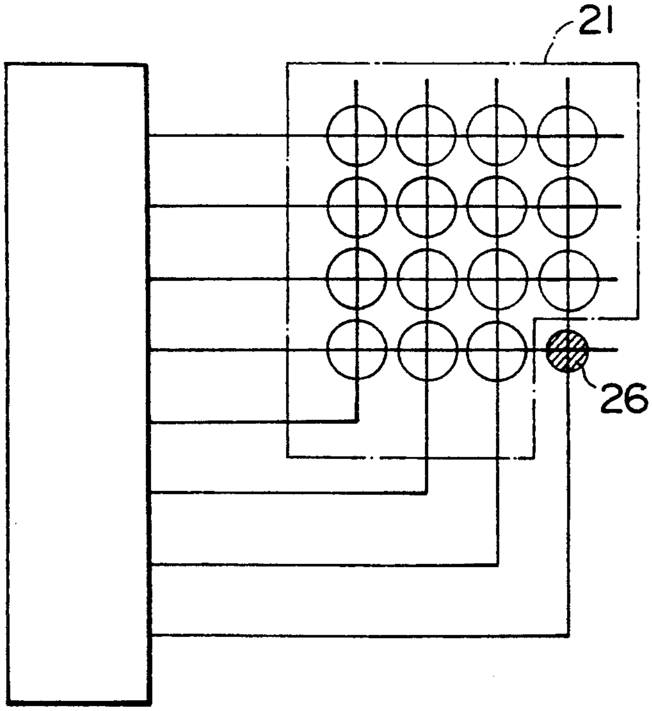
FIG. 7 is a block diagram of a circuit of the key matrix as another example.

FIG. 4 is a perspective view of a panel switch in a disassembled state, FIG. 5 is a side sectional view showing the panel switch in an operating state, FIG. 6 shows a key matrix for the panel switch as an example, and FIG. 7 shows another key matrix for the panel switch as another example.

With reference to FIG. 4, a flexible pattern circuit (hereinafter referred to as "FPC") 16 is equipped with movable contacts 17 and fixed contacts 18. A spacer 19 has openings 20 at positions corresponding to the movable contacts 17 and the fixed contacts 18 when the FPC 16 is folded. Thus, a switching unit 21 is formed from the FPC 16 and the spacer 19. This switching unit 21 is applied onto a substrate board 22. Diaphragms 24 are located in openings 23 of other spacers 25. Projecting parts 25' of the FPC 16 hold the spacers 25 therebetween, so as to form push switches 26 with click mechanism. After the push switches 26 with the click mechanism are folded to the back side of the substrate board 22, the switch unit 21 is received in a lower casing 27, in a manner such that projections 28 of the lower case 27 come in contact with the push switches 26, while other projections 29 formed at the substrate board 22 come in contact with the lower casing 27.

Knobs 30 are disposed at positions corresponding to each of the switches in the switching unit 21. An upper casing 31 has openings 32 where the knobs 30 are located. The knobs 30 and the switching unit 21 are put between the lower casing 27 and the upper casing 31.

The operation of the panel switch with the click mechanism will be described in the following description with reference to FIGS. 5a-5c.

FIG. 5a shows a stationary state, wherein the switching unit 21 and the push switch 26 with the click mechanism are turned off.

FIG. 5b shows a state, where a slight pushing force is applied onto the knob 30. In this state, the switching unit 21 is switched on, and a micro computer is operated to detect which switch in the key matrix under-mentioned is pushed on. However, since the push switches 26 with the the click mechanism are still turned off in this state, switching ON is not recognized.

FIG. 5c shows a state, where a large pushing force is applied onto the knob 30 to swing the substrate board 22 around the projection 29 so that the push switch 26 with the click mechanism is turned on. Herein, click feeling is provided on the knob 30 owing to the reversion of the diaphragm 24. By the switching, the micro computer determines that the detected switch in the switching unit 21 is turned ON.

When the pushing force charged on the knob 30 is reduced from this state, the push switch 26 with the click mechanism is turned OFF by the reversing force of the diaphragm 24, and the micro computer recognizes that the detected switch in the switching unit 21 is turned OFF.

The operation afore-mentioned is further explained in the following with reference to the key matrix shown in FIG. 6.

The first switching unit 21 and the push switches 26 with the click mechanism are connected through independent circuits with the micro computer. The processing of the key matrix with the micro computer is performed as follows. Input data is discriminated by the switching operation of a specified switch in the switching unit 21. The input data is then transmitted by the switching operation of the push switch 26 with the click mechanism.

FIG. 7 shows another example of the key matrix to be used in the present invention. In this example, the switching unit 21 and the push switch 26 are connected to the same key matrix.

As afore-mentioned, the input data is identified by the operation of the switching unit 21, and then transmitted by the switching operation of the push switch 26. Thus, a panel switch equipped with the click mechanism is constituted by switching unit 21 which does not have a click mechanism and a small number of push switches 26 with a click mechanism.

In the example afore-mentioned, the input data is identified by the switching unit 21 and then transmitted by the push switch 26 with the click mechanism. However, both the identification and transmission of the input data may be simultaneously performed by the switching unit 21. In this case, a mere click mechanism may be adopted instead of the push switches 26 with the click mechanism. This kind of constitution is of course in the scope of the present invention.

Other examples of the present invention will be described with reference to FIGS. 8-15.

Figure 8:
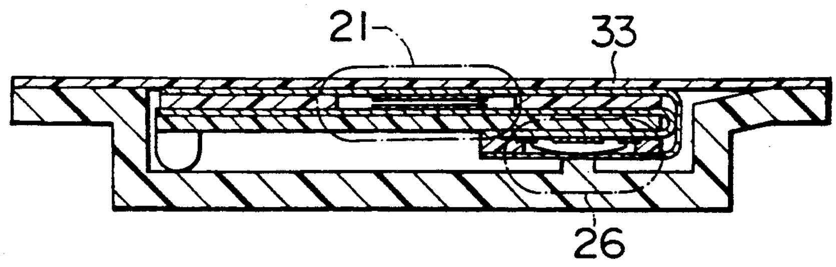
FIG. 8 is a side sectional view of a panel switch in another embodiment of the present invention.
Figure 9:
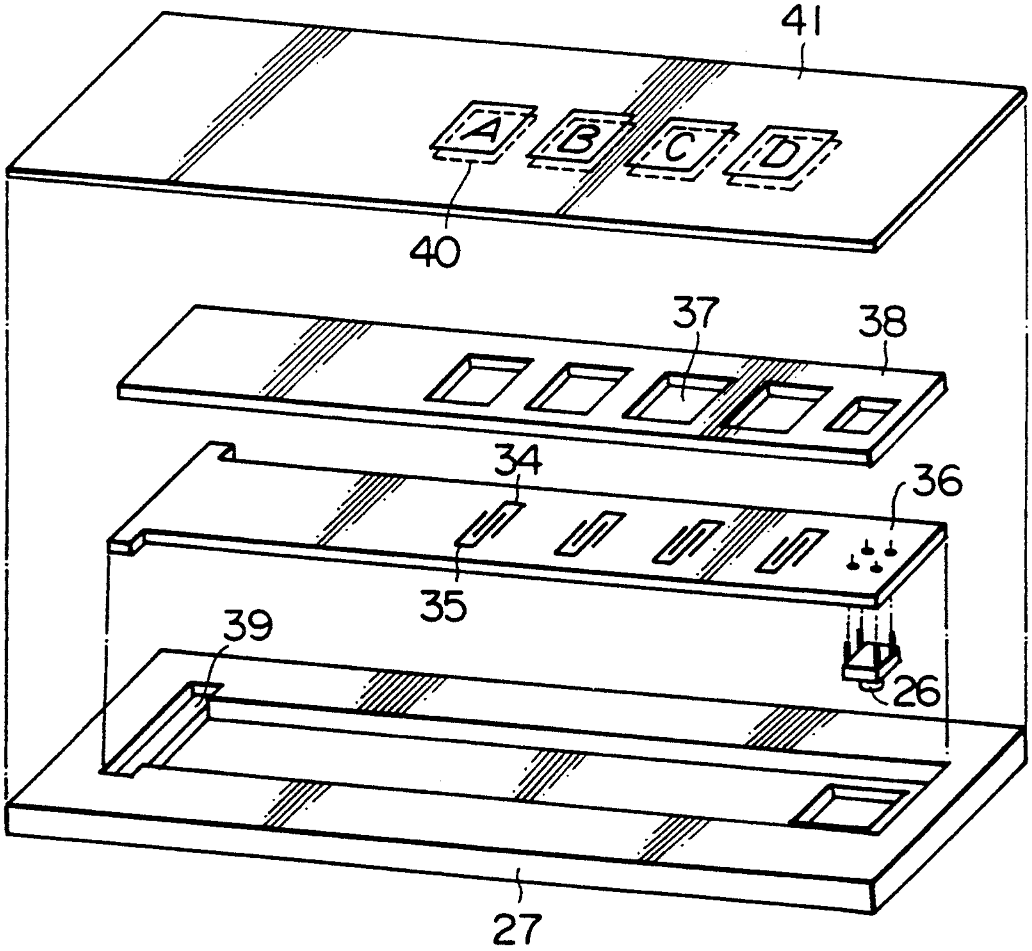
FIG. 9 is a perspective view of the disassembled panel switch in the embodiment as shown in FIG. 8.
Figure 10A:
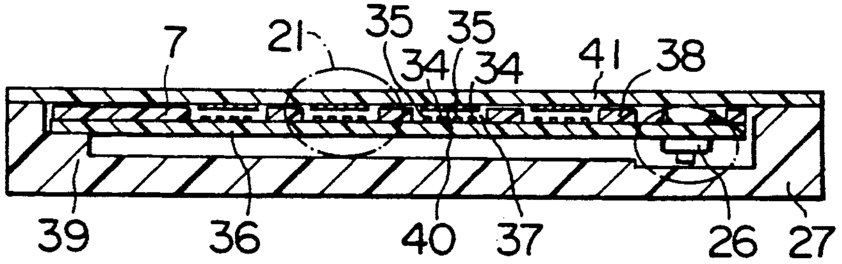
FIGS. 10*a* and 10*b* are side sectional views showing the operating state of the panel switch in the embodiment as shown FIG. 8.
Figure 10B:
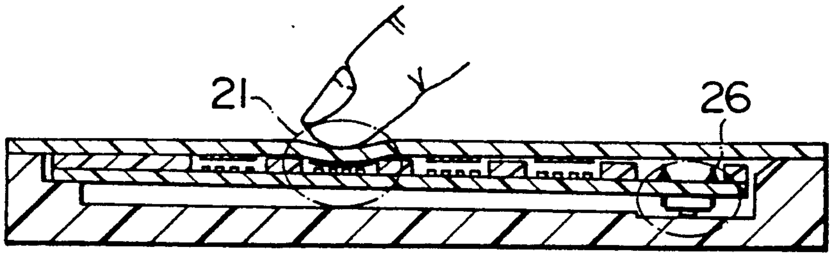
Figure 11:
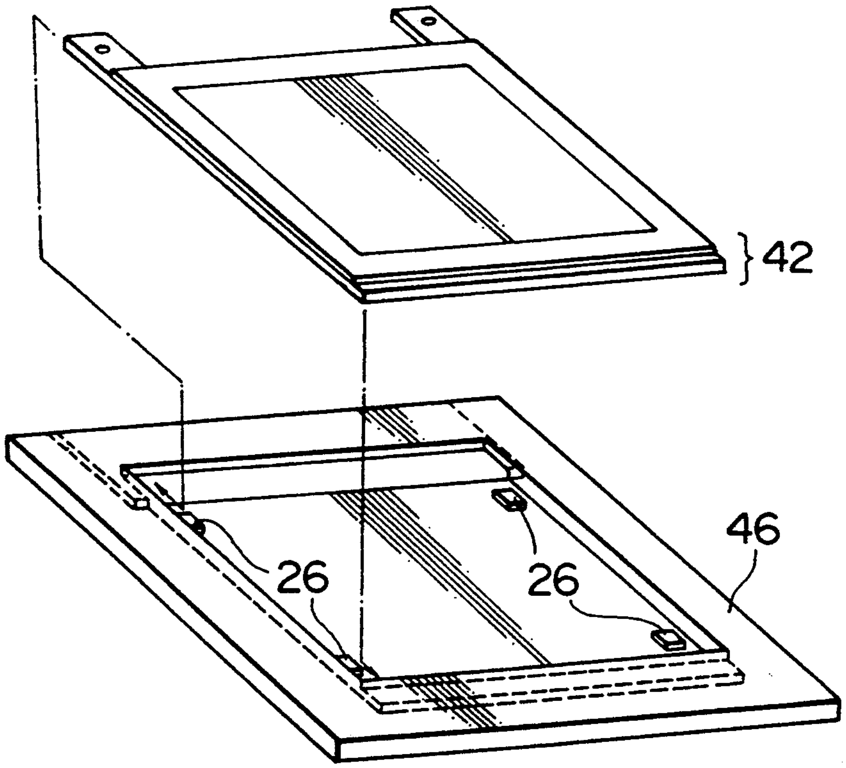
FIG. 11 is a perspective view of an input tablet in a disassembled state for a position detector to which the present invention is applied.
Figure 12A:
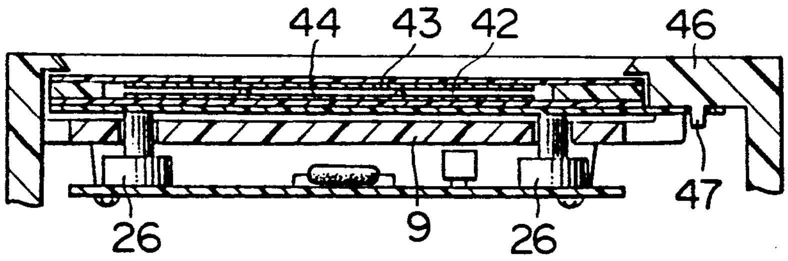
FIGS. 12*a* and 12*b* are side sectional views showing the operating state of the input tablet.
Figure 12B:
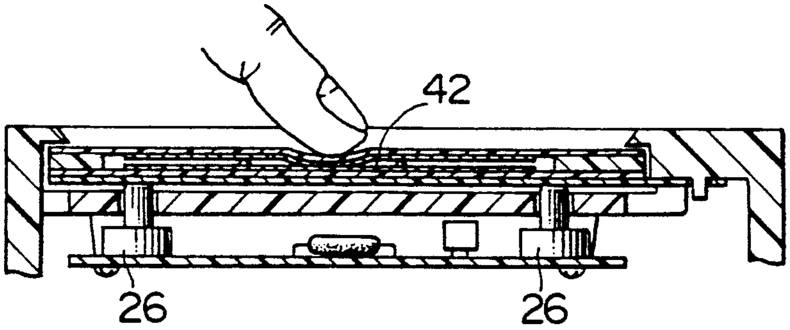
Figure 13A:
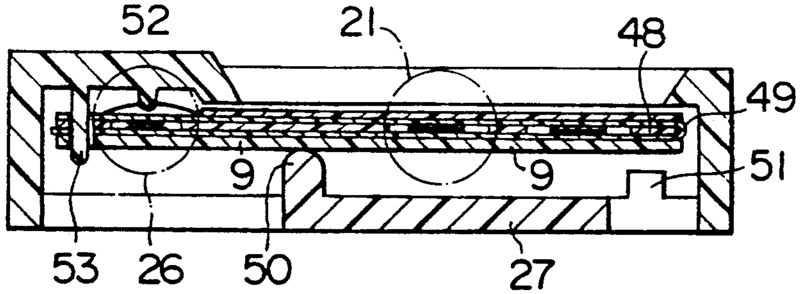
FIGS. 13*a* and 13*b* are side sectional views showing the operating state of a panel switch in another embodiment of the present invention.
Figure 13B:
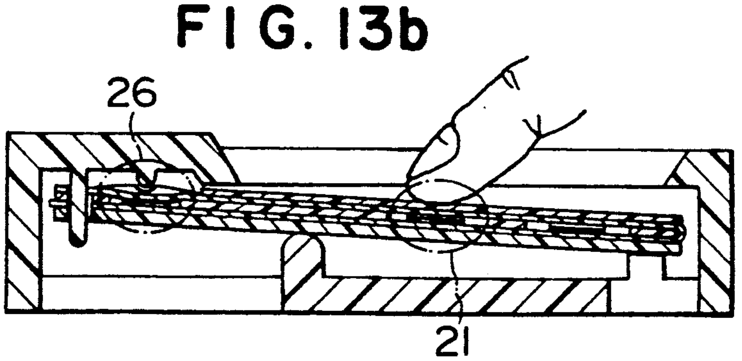
Figure 14A:
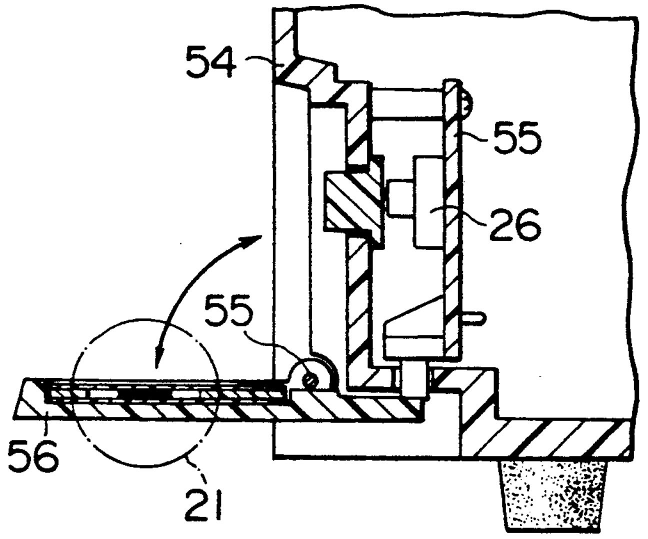
FIGS. 14*a* and 14*b* are side sectional views showing the operating state of a panel switch in another embodiment applied to AV equipment such as a videotape recorder.
Figure 14B:
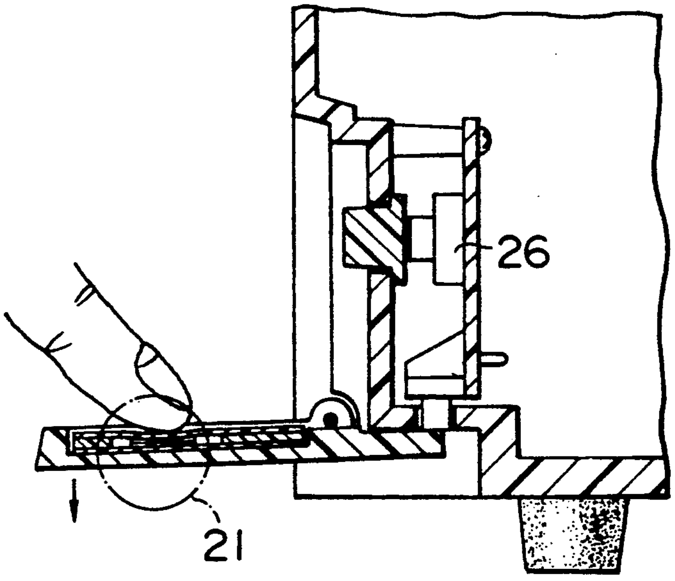
Figure 15A:
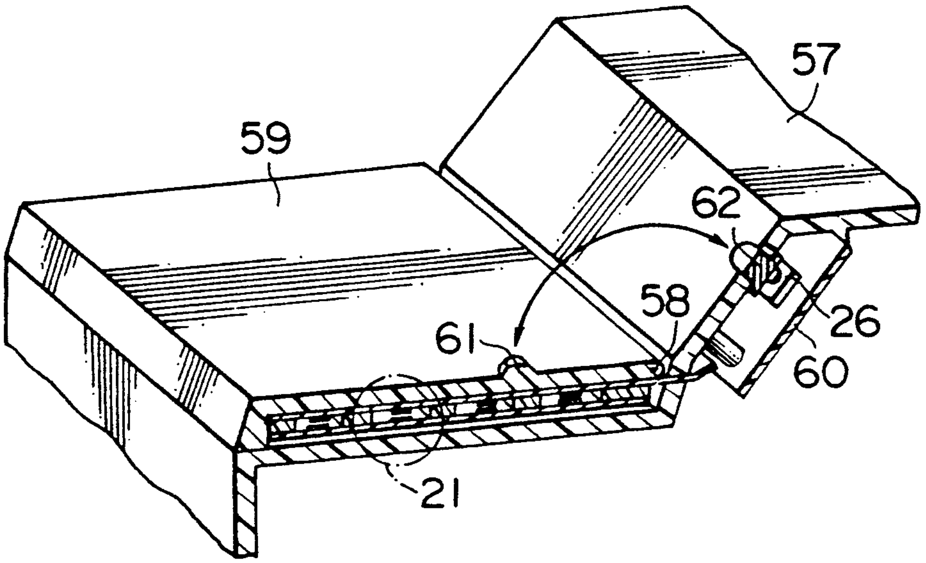
FIGS. 15*a* and 15*b* are perspective views of a panel switch in another example applied to OA equipment such as a telephone or facsimile.
Figure 15B:
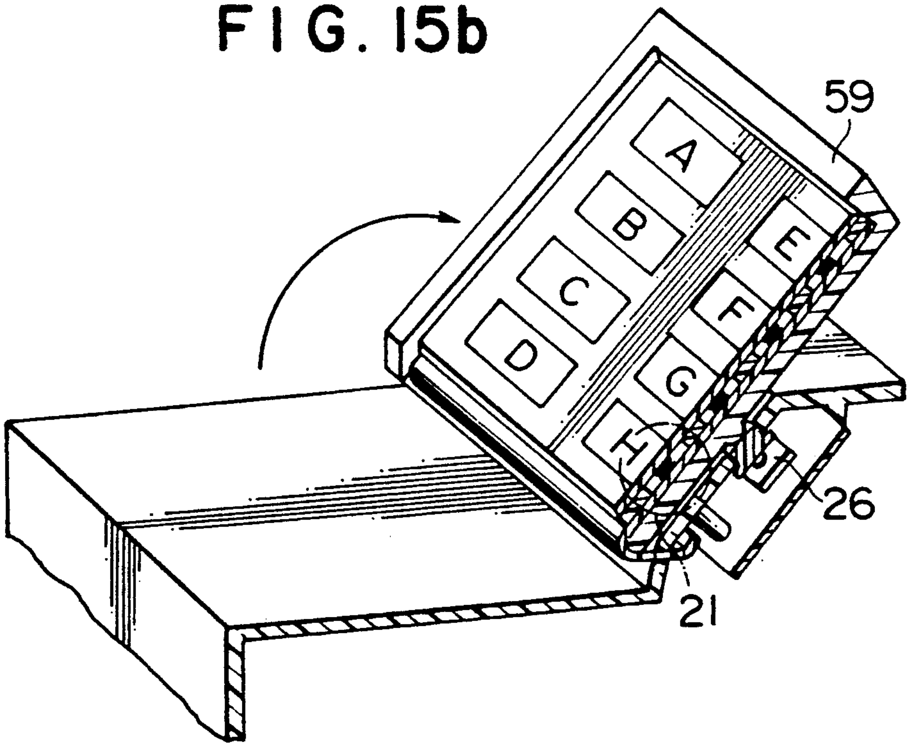

FIG. 8 is a sectional view of a panel switch in another embodiment of the present invention. FIG. 9 is a perspective view of the disassembled panel switch in this embodiment. FIGS. 10a and 10b are side sectional views showing the operating state of the panel switch in FIG. 9. FIG. 11 is a perspective view showing the structure of a disassembled panel switch with a click mechanism according to the present invention used as an input tablet for a position detector. FIGS. 12a and 12b are side sectional views of said panel switch in an operating state. FIGS. 13a and 13b are side sectional views of a panel switch in another embodiment. FIGS. 14a and 14b are side sectional views of a panel switch in another example. FIGS. 15*a* and 15*b* are also side sectional views of a panel switch in another example. Explanation on the same parts as those shown in FIGS. 4–7 is omitted in the following description.

In the Panel switch shown in FIG. 8, a panel equipped with click switches is made thinner by applying an elastic sheet 33 on which a knob design is printed onto a first switching unit 21.

In the example shown in FIG. 9, a panel switch is also made thinner as same as the type in FIG. 8. Herein, stationary contacts 34, 35 are disposed adjacent to each other on a printed circuit board 36. A spacer 38 having openings 37 at positions corresponding to the stationary contacts 34, 35 is mounted on the printed circuit board 36. A push switch 26 with a click mechanism is attached to the back surface of the spacer 38 at the right hand. These parts are received in a lower casing 27 having a printed circuit board holding part 39 at a position opposite to the push switch 26. A design panel 41, on which movable contacts 40 are attached at positions corresponding to the stationary contacts 34, 35, is mounted on the spacer 38, and the periphery of the design panel 41 is stuck onto the lower casing 27.

FIGS. 10*a* and 10*b* are side sectional views of the panel switch shown in FIG. 9. FIG. 10*a* illustrates the panel switch in a stationary state, while FIG. 10*b* illustrates the state of the first switching unit 21 being in contact with the push switch 26 with the click mechanism.

FIG. 11 shows a panel switch to be used as an input tablet 42 for a position detector in an example of the present invention. In this case, the input tablet 42 is mounted on push switches 26 with click mechanisms, so as to provide the panel switch with click mechanism.

FIGS. 12*a* and 12*b* are side sectional views showing the operating state of the panel switch in FIG. 11. FIG. 12*a* illustrates the stationary state of the panel switch. FIG. 12*b* illustrates the state that an upper resistor 44, which is usually held at a position separate from a lower resistor 45 by dot spacers 43 of the input tablet 42, is moved into contact with the lower resistor 44 by a finger pressure to detect position, while a push switch 26 with a click mechanism at the right hand is held in switching state. The positions of an upper casing 46 and the tablet 42 with respect to a substrate board 9 are defined by a stopper 47 formed on the upper casing 46. Herein, the panel switch 26 is assembled in a manner such that the transmission of input data can be executed when any one of the switches in the panel switch 26 with the click mechanism is turned on.

FIGS. 13*a* and 13*b* show an embodiment wherein a push switch 26 with a click mechanism is disposed on the same plane with a first switching unit 21. In this embodiment, a spacer 48 and an FPC 49 are useful both for the switching unit 21 and the push switch 26 with the click mechanism, so that manufacturing cost can be reduced. In the drawings, reference numeral 50 is a holding projection formed on a lower casing 27, reference numeral 51 is a projection formed on the lower casing 27 for inhibiting the excessive press-down of the switching unit 21, reference numeral 52 is a projection formed on an upper casing 31 for pushing the push switch 26 with the click mechanism, and reference numeral 53 is a projection formed at the upper casing 31 for defining the position of a substrate board 22. Herein, FIG. 13*a* illustrates a stationary state, while FIG. 13*b* illustrates the state that the switching unit 21 and the push switch 26 with the click mechanism are both turned on.

The operation of the panel switch with click mechanism will be described in the following with reference to FIGS. 13*a* and 13*b*.

When a pushing force is applied onto the switching unit 21, the switching unit 21 is turned on at first. Thereafter, the substrate board 22 starts clockwise rotation around the holding projection 50 of the lower casing 27 as a fulcrum, until the push switch 26 with the click mechanism is turned on by the projection 52 of the upper casing 31 as shown in FIG. 13*b*. At this time, the excessive press-down inhibiting projection 51 limits the movement of the substrate board 22 with in an allowable range to inhibit the deformation of the substrate board 22.

FIGS. 14*a* and 14*b* show an example where the present invention is applied to AV equipment such as a videotape recorder.

In this example, a cover 56 is rotatably attached to a main casing 54 with a rotational shaft 55, a switching unit 21 is incorporated in the cover 56, and a push switch 26 with click mechanism is attached to a printed circuit board 55 received in the main casing 54.

FIG. 14*a* illustrates the state that the cover 56 is opened. In this state, a switching unit 21 and the push switch 26 with the click mechanism are both turned off. When a pushing force is applied onto the switching unit 21 in such a state as shown in FIG. 14*b*, the switching unit 21 is turned on at first. Thereafter, the cover 56 is rotated as a whole along the anticlockwise direction, so that the pushing force is transmitted through the right end of the cover 56 to the push switch 26 with the click mechanism. Thereby, the push switch 26 is turned on, click feeling is fed to the cover 56, and input data is transmitted at the same time.

FIGS. 15*a* and 15*b* show an example where the present invention is applied to OA equipment such as a telephone, facsimile or duplicator. In this example, a cover 59 is rotatably attached to a main casing 57 with a rotational shaft 58, and a push switch 26 with a click mechanism is attached to a main printed circuit board 60 received in a main casing 57 incorporating a switching unit 21 therein.

FIG. 15*a* illustrates the state that the cover 59 is closed while FIG. 15*b* illustrates the state that the cover 59 is opened. A pushing force from the switching unit 21 is transmitted to the push switch 26 with the click mechanism through a push knob 61 formed on the cover 59 and another knob 62 attached to the main casing 57. Herein, a release type switch with a click mechanism such as a micro switch or lever switch may be used as the push switch 26 with the click mechanism.

FIGS. 16–38 show other examples of the present invention using a vibration unit as click mechanism.

Figure 16:
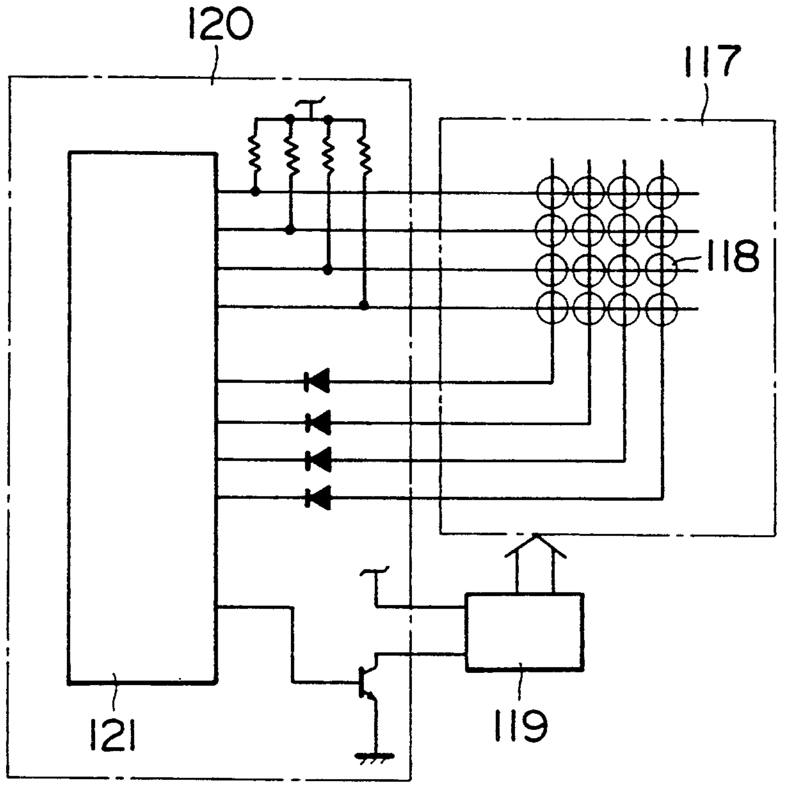
FIG. 16 is a block diagram of a circuit for a panel switch in another embodiment of the present invention.

FIG. 16 is a block diagram of a circuit. In FIG. 16, reference numeral 117 is a switching unit comprising one or more switches 118, reference numeral 119 is a vibration unit for vibrating the switching unit 117, and 120 a control unit for detecting switching input applied to the switches 118, actuating the vibration unit 119 and controlling the magnitude of the vibration.

The operation of this panel switch will be described in the following.

When one of the switches 118 in the switching unit 117 is turned on by a finger pressure, the control unit 120 detects the switching input applied to the switch 118 and transmits the resulting drive signal to the vibration unit 119. The vibration unit 119 is vibrated in response to the transmitted drive signal. The switching unit 17 is vibrated accompanied with the vibration of the vibration unit 119, so that the vibration of the switching unit 117 is transmitted as switching feeling to the finger of an operator. Herein, the drive signal to be applied to the vibration unit 117 may be changed in response to the input applied to the switch 118 by a micro computer 21 in the control unit 120, so as to adjust the switching feeling. For instance, by changing a transmission duty ratio to the vibration unit 119, the magnitude of the vibration, a number of signal transmission and/or frequency of signal transmission, different switching feeling may be provided.

FIGS. 17-38 more concretely show panel switches in many specific embodiments according to the present invention.

Figure 17:
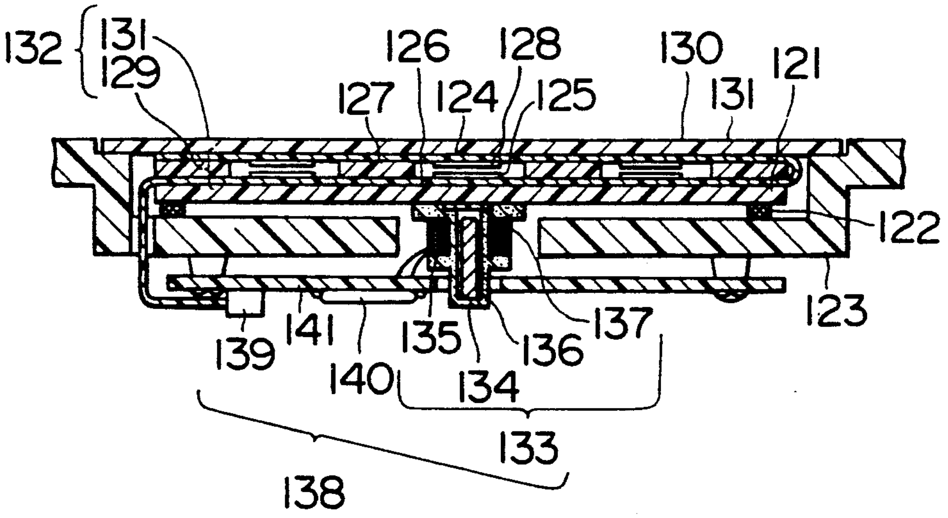
FIG. 17 is a sectional view of the panel switch.

FIG. 17 is a sectional view of a panel switch using a magnetic body as a vibration unit.

Figure 18A:
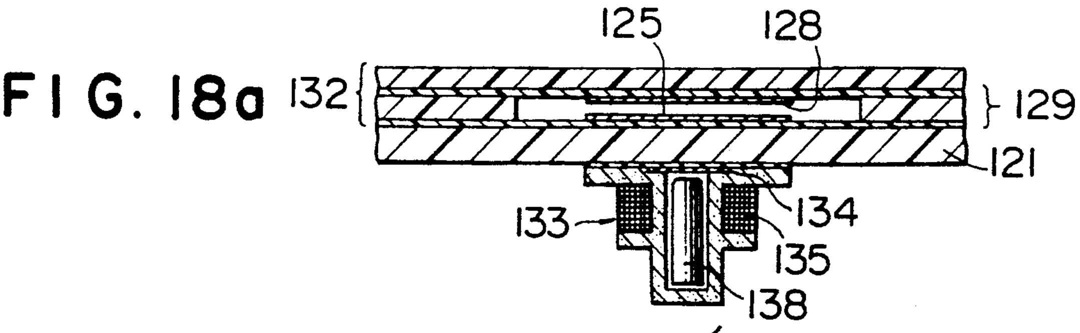
FIGS. 18*a*–18*c* are views showing the operating state of the panel switch in the embodiment as shown in FIG. 17.
Figure 18B:
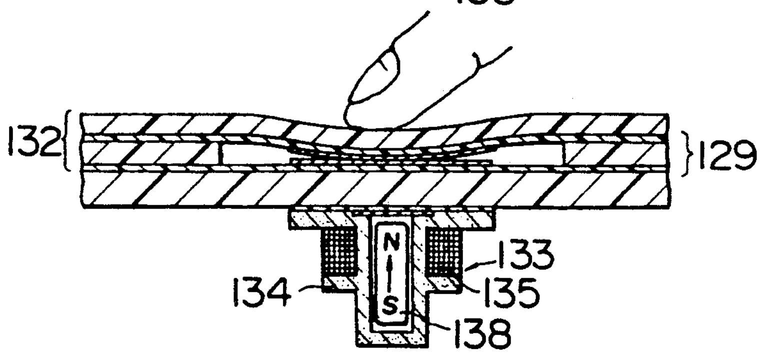
Figure 18C:
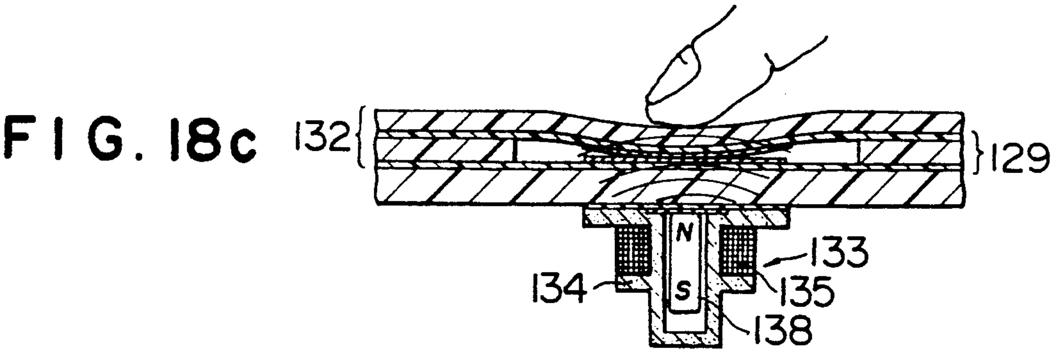

FIGS. 18*a*-18*c* are sectional views of said panel switch in an operating state.

FIGS. 19*a*-28 show other examples of a panel switch using a magnetic body as a vibration unit.

Figure 29A:
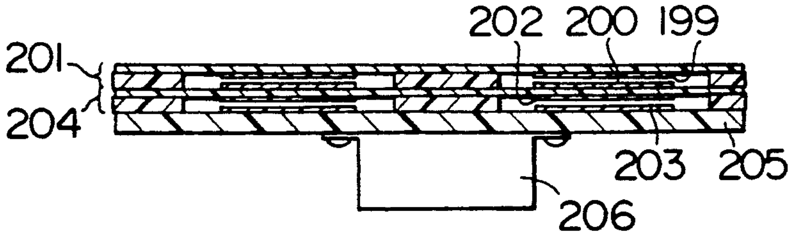
FIGS. 29a-29c are sectional views of a panel switch formed into a two step type in another embodiment of the present invention.
Figure 29B:
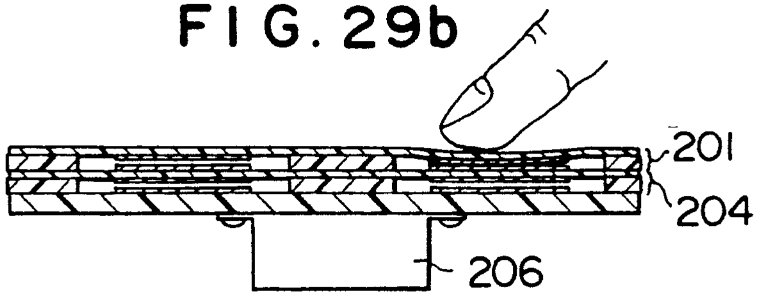
Figure 29C:
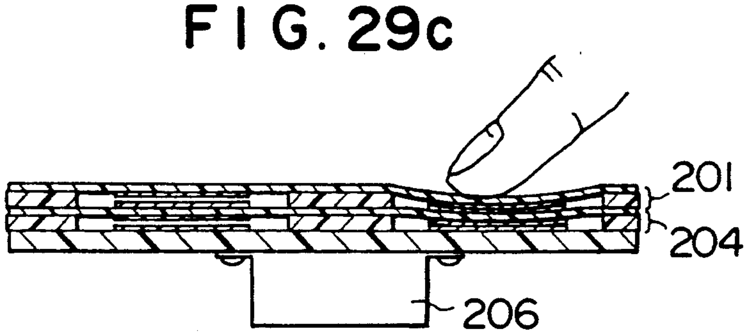

FIGS. 29*a*-29*c* are sectional views of a panel switch in an example using a two-step switch as the panel switch.

Figure 30:
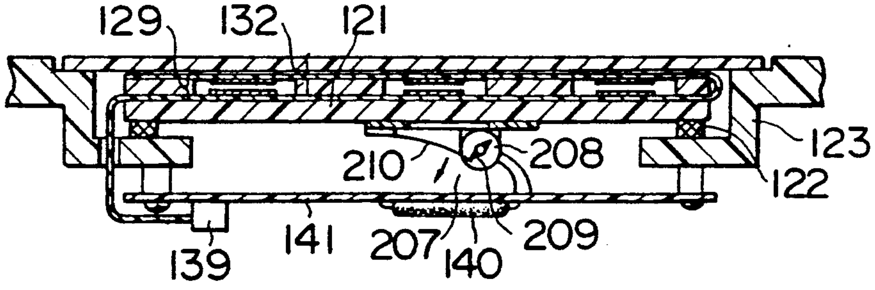
FIG. 30 is a sectional view of a panel switch in another example using a vibration unit comprising a motor and a cam.

FIG. 30 is a sectional view of a panel switch in an example using a vibration unit comprising a motor and a cam.

Figure 31:
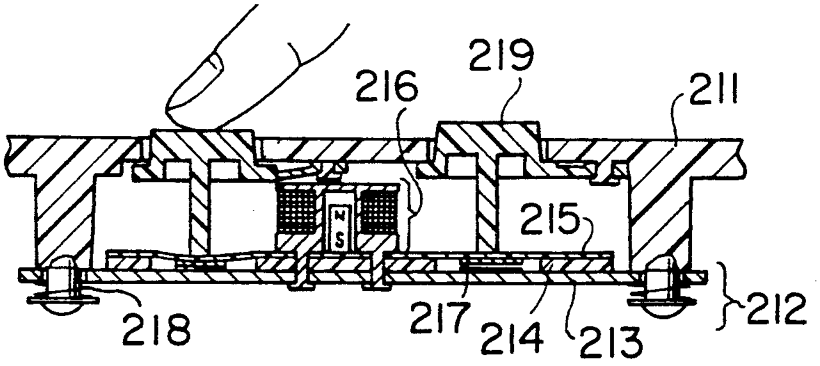
FIG. 31 is a sectional view for explaining another example applied to a panel switch equipped with knobs.

FIG. 31 is a sectional view for explaining an example of the present invention applied to a panel switch with knobs.

Figure 32:
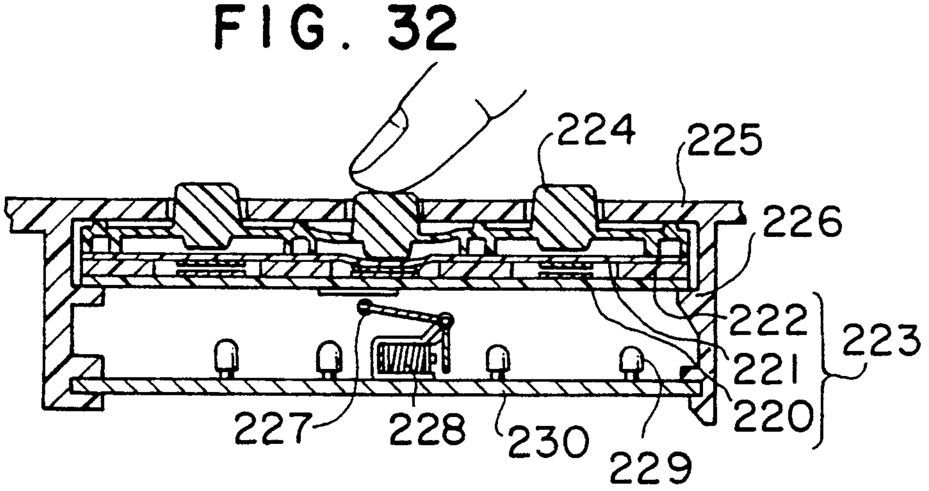
FIG. 32 is a sectional view for explaining another example applied to a water-proof lighting panel switch.

FIG. 32 is a sectional view for explaining an example of the present invention applied to a waterproof lighting panel switch.

Figure 33:
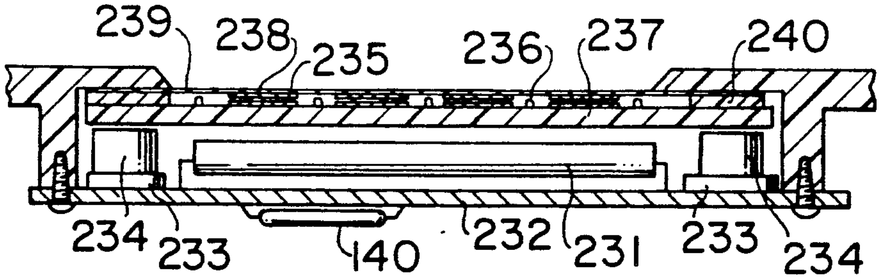
FIG. 33 is a sectional view for explaining another example applied to a transparent panel switch.

FIG. 33 is a sectional view for explaining an example of the present invention applied to a transparent panel switch.

Figure 34:
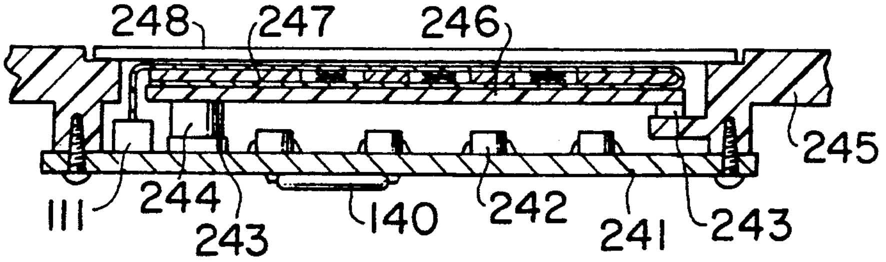
FIG. 34 is a sectional view for explaining another example applied to a lighting membrane switch.

FIG. 34 is a sectional view for explaining an example of the present invention applied to a lighting membrane switch.

Figure 35A:
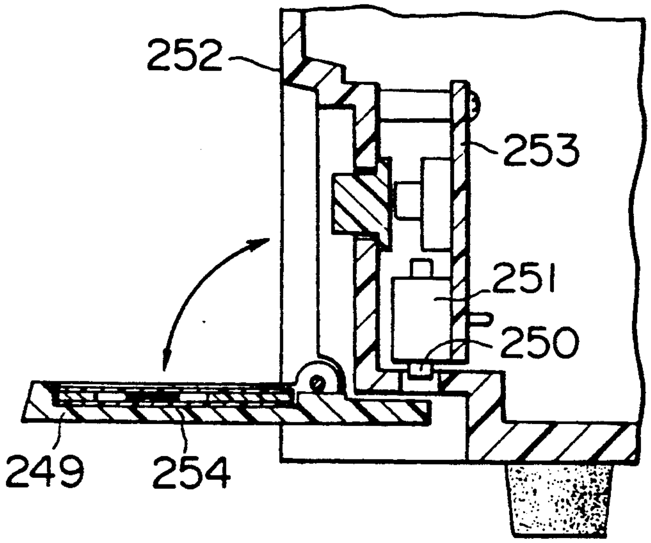
FIG. 35a and 35b are sectional views for explaining another example applied to AV equipment such as a videotape recorder.
Figure 35B:
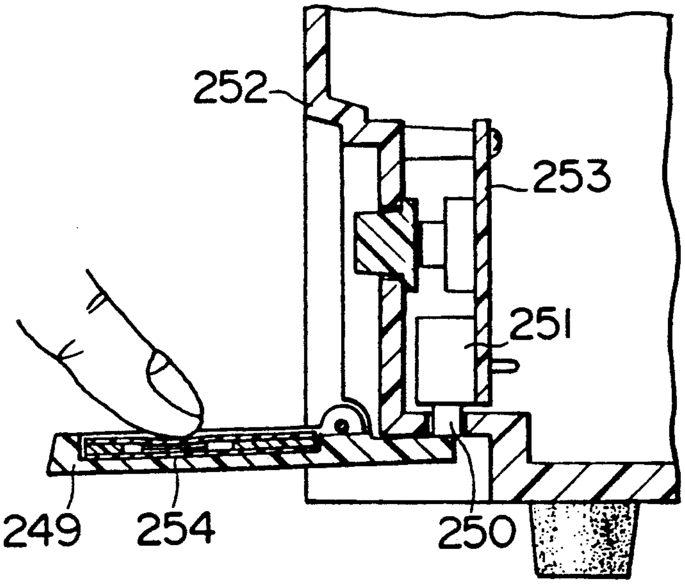

FIGS. 35*a* and 35*b* are sectional views for explaining an example of the present invention applied to AV equipment such as a videotape recorder.

FIG. 36 shows another example applied to the same AV equipment.

Figure 37:
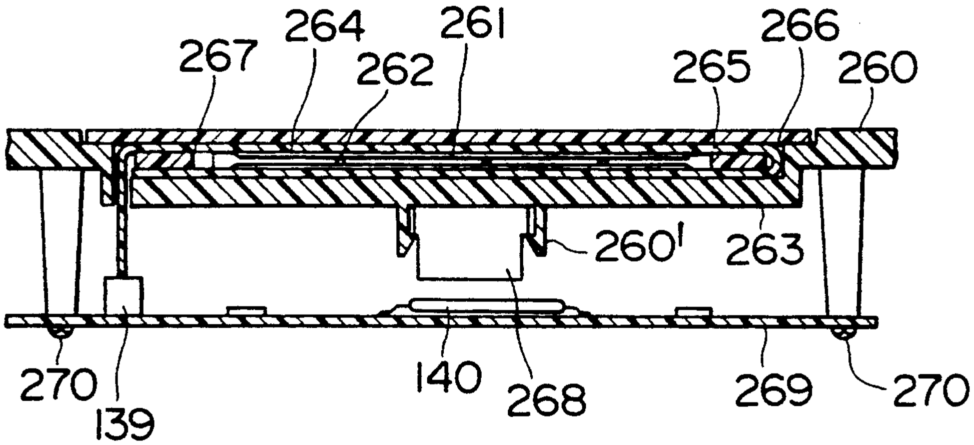
FIG. 37 is a sectional view of a panel switch in an example to be used as an input tablet for a position detector.

FIG. 37 is a sectional view for explaining an example of the present invention applied to an input tablet for a position detector.

Figure 38:
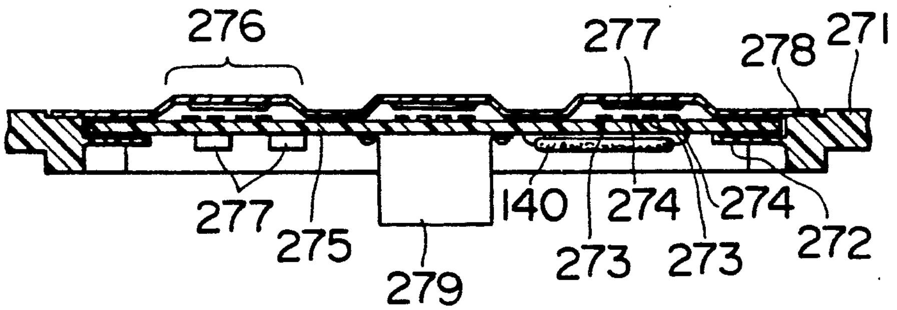
FIG. 38 is a sectional view of a panel switch in another example.

FIG. 38 is a sectional view for explaining an example of the present invention applied to a panel switch.

With reference to FIG. 17 showing the section of a panel switch, a substrate board 121 made of ferromagnetic plastic, iron or stainless steel is mounted on a casing 123 through the intermediary of a damper 122 made of elastic rubber or sponge. An upper FPC 124 is equipped with movable contacts 128 at positions facing, through a spacer 127, fixed contacts 125 formed on a lower FPC 126 mounted on the substrate board 121. A membrane switch 129 is constituted by the upper FPC 124, the spacer 127 and the lower FPC 126. On this membrane switch 129, there is mounted a design panel 131, to which a knob design 130 is applied. The design panel 131 is fixed to the casing 123 at its periphery by an adhesive. The membrane switch 129 and the design panel 131 constitute a switching unit 132.

A plunger 133 acting as a vibration unit fixed to the lower side of the substrate board 121 comprises a bobbin 134, a coil 134, a rod 136 made of ferromagnetic material, and a silencer cap 137.

A control unit 138 comprises a connector 139 electrically connected to a part extending from the lower FPC 126 of the membrane switch 129 under the casing 123, a micro computer 140 for detecting turn-on and -off of the membrane switch 129 and controlling the plunger 133, and a printed circuit board 141 for electrically connecting the connector 139, the plunger 133 and the micro computer 140 to each other.

With reference to FIGS. 18*a*, 18*b* and 18*c*, the operation of the panel switch shown in FIG. 17 is explained in the following. These drawings illustrate the main part of the panel switch in an enlarged scale.

The panel switch is in a stationary state as shown in FIG. 18*a*. When a movable contact 128 is moved into contact with a corresponding fixed contact 125 by a finger pressure to turn on the membrane switch 129 as shown in FIG. 18*b*, the control unit 138 detects the switching operation and applies a drive current to the coil 135 of the vibration unit 133. The rod 138 located inside the coil 135 is magnetically energized and moved toward the substrate board 121 made of ferromagnetic material. The rod 138, coming into collision with the silencer cap 137 as shown in FIG. 18*c*, is magnetically attracted thereto. On this occasion, the impact of the collision is transmitted as switching feeling to the finger through the switching unit 132.

When the membrane switch 129 is turned off while holding the finger in slight contact with the switching unit 132, the drive current in the coil 135 is interrupted by the control unit 138, and the rod 138 is deenergized and dropped onto the bottom of the bobbin 134 by its own gravity to provide a slight impact. The slight impact is transmitted as switching feeling through the switching unit 132 to the finger. Herein, the rod 138 may be forcedly returned onto the bottom of the bobbin 134 by the resilient force of a spring or the like.

Other examples using a magnetic body are explained in the following with reference to FIGS. 19*a*-28. The same parts of the panel switch are alloted with the same numbers, and explanation for these parts is omitted in the following.

Figure 19A:
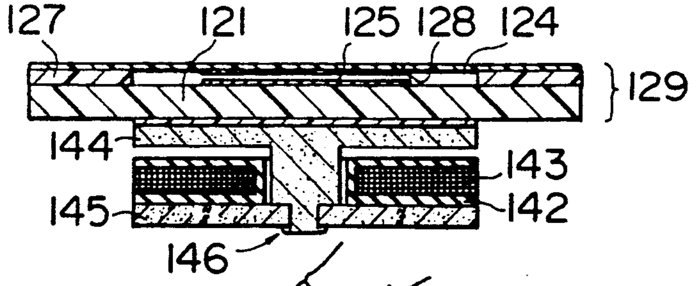
FIGS. 19a-28 are sectional views of panel switches in other examples using a magnetic body as a vibration unit.
Figure 19B:
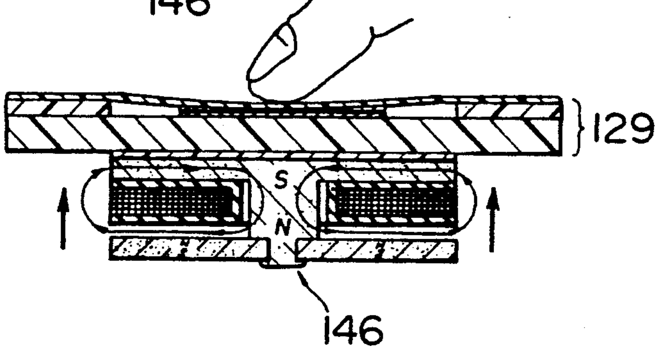

With reference to the FIGS. 19*a* and 19*b*, a vibration unit 146 comprises a movable bobbin 142, a permanent magnet 145 and a holder 144 for slidably holding the movable bobbin 142 between a membrane switch 129 and the permanent magnet 145. A hole is formed in the movable bobbin 142 at the center, and a coil 143 is wound on the movable bobbin 142. One side of the holder 144 is attached to the membrane switch 129, while the permanent magnet 145 is attached to the other side of the holder 144.

The operation of this panel switch will be apparent in the following.

When an electric current is applied to the coil 143, the upper part of the movable bobbin 142 is magnetically charged with S polarity while the lower part is charged with N polarity. Consequently, a magnetic repelling force is generated between the permanent magnet 145 and the movable bobbin 142, so that the movable bobbin 142 comes into collision with the upper part of the holder 144 to provide switching feeling.

When the membrane switch 129 is turned off, the supply of an electric current to the coil 143 is reversed. Thereby, a reversal magnetic force is exerted on the bobbin 142 so that the bobbin 142 comes into collision with the permanent magnet 145. The supply of an electric current to the coil 143 may be interrupted to shift the bobbin 142. In this case, the bobbin 142 comes into collision with the permanent magnet 145 by its own gravity. The impact of the collision provides switching feeling.

Figure 20A:
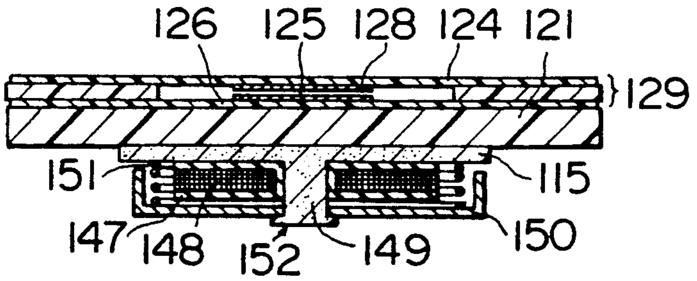
Figure 20B:
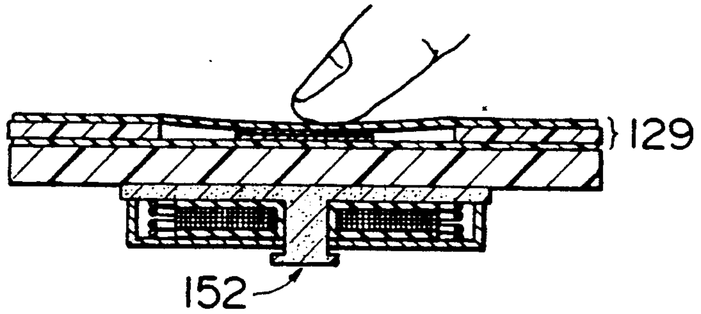

In FIGS. 20a and 20b, a bobbin 147, onto which a coil 148 is wound, is fixed to a projecting magnetic piece 149. A cup-shaped movable magnetic piece 150 is pressed onto one side of the projecting magnetic piece 149 by the resilient force of a spring 151. In this example, a vibration unit 152 comprises the bobbin 147 on which the coil 148 is wound, the projecting magnetic piece 149 and the movable magnetic piece 150.

When an electric current is applied to the coil 148, the movable magnetic piece 150 comes into collision with the bobbin 147. When the supply of an electric current is interrupted, the movable magnetic piece 150 comes into collision with the top end of the projecting magnetic piece 149 due to the resilient force of the spring 151. Thus, switching feeling is provided.

Figure 21A:
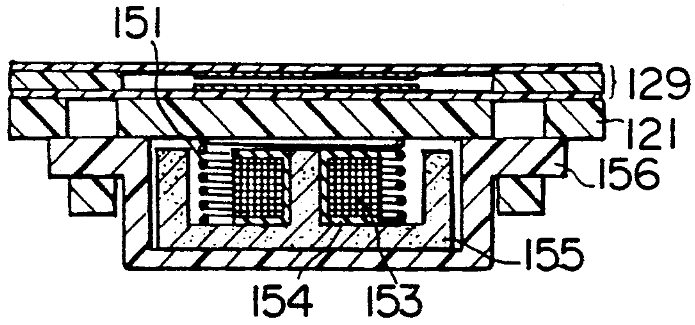

In FIG. 21a, a bobbin 154 onto which a coil 153 is wound is attached to the bottom of a movable magnetic piece 155 which is received movably along a vertical direction in a holding cover 156.

Figure 21B:
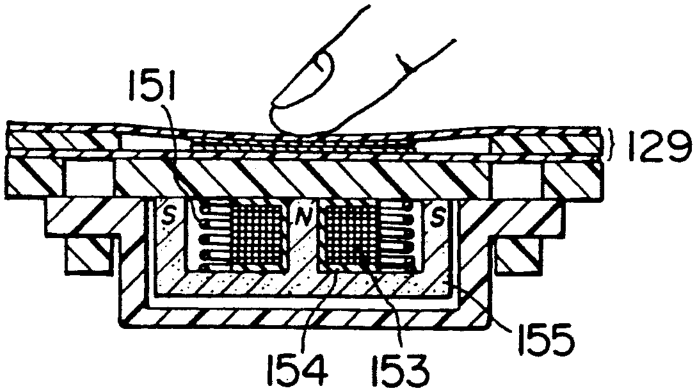

When an electric current is applied to the coil 153, the movable magnetic piece 155 comes into collision with a substrate board 121 as shown in FIG. 21b. When the supply of an electric current to the coil 153 is interrupted, the movable magnetic piece 155 comes into collision with a protective cover 156 due to the resilient force of the spring 151. Thus, switching feeling is provided.

Figure 22A:
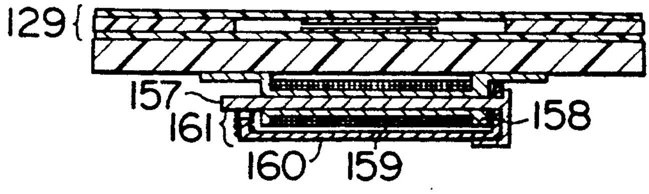
Figure 22B:
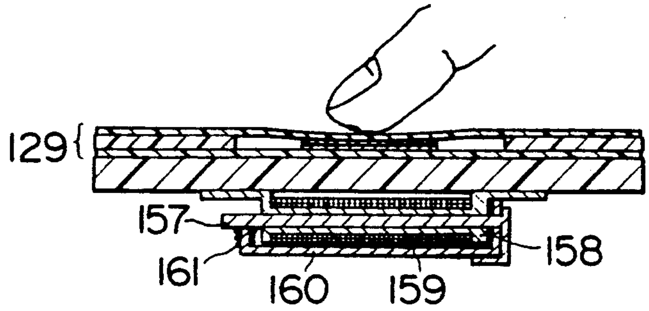

In FIGS. 22a and 22b a panel switch comprises an electromagnetic body, a movable magnetic piece 160 and a spring 161. The electromagnetic body is formed by winding a coil 159 onto a bobbin 158 having a magnetic piece 157 at the central position. The movable magnetic piece 160 has one end joined in contact with one end of the magnetic piece 157 and the other free end which can come in contact with or separate from the magnetic piece 157. This movable magnetic piece 160 is disposed in a state capable of swinging about the joined end as a fulcrum. A resilient force of the spring 161 is exerted on the free end of the movable magnetic piece 160 and the magnetic piece 157 to separate them from each other.

When an electric current is applied to the coil 159, the movable magnetic piece 160 is attracted to the magnetic piece 157. When the current supply is interrupted, the movable magnetic piece 160 is separated from the magnetic piece 157 by the resilient force of the spring 123. Thus, switching feeling is provided.

Figure 23A:
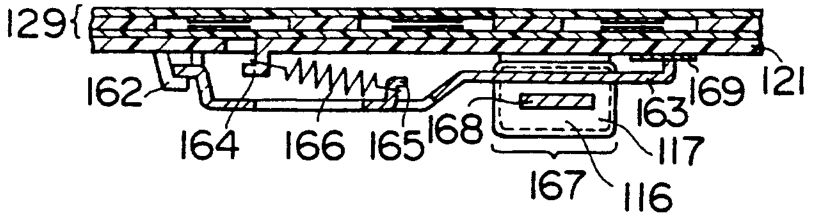

In the panel switch shown in FIGS. 23a–23c, a movable magnetic piece 163 is disposed in a state rotatable around a claw 162 formed below and attached on a substrate board 121, and a spring 166 for urging the movable magnetic piece 163 toward the substrate board 121 is stretched between another claw 164 formed on the substrate board 121 and a claw 165 formed on the movable magnetic piece 163. Another magnetic piece 168 is located at a position where the movable magnetic piece 163 is separated from the substrate board 121 by magnetic attractive force during exciting the electromagnetic body 167.

Figure 23B:
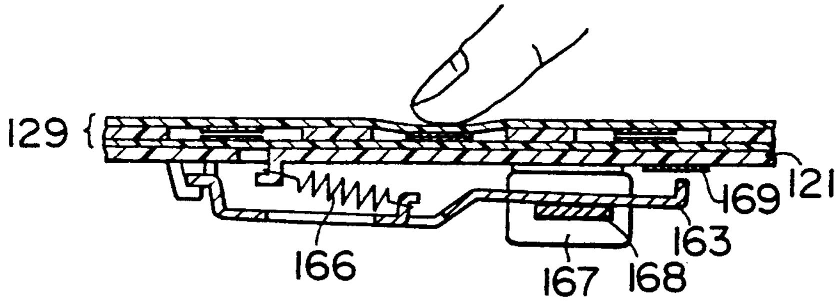
Figure 23C:
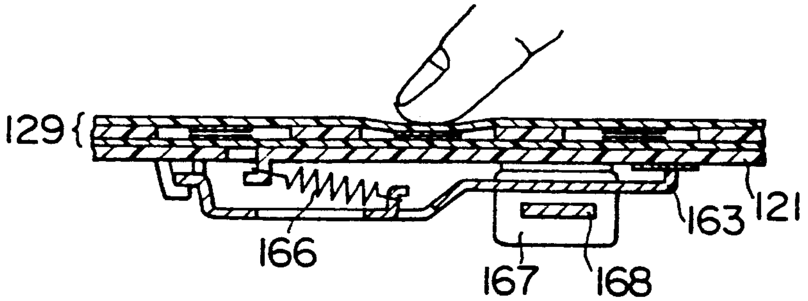

When the electromagnetic body 167 is excited, the movable magnetic piece 163 is attracted to the magnetic piece 168 as shown in FIG. 23b. When the excitation of the electromagnetic body 167 is interrupted, the movable magnetic piece 163 comes into collision with the substrate board 121 due to the righting moment of the spring 166 as shown in FIG. 23c. Thus, switching feeling is provided. Hereon, since noise is generated by the collision of the movable magnetic piece, a silencer sheet 169 made of an elastic material such as polyester film or vinyl sheet may be applied onto a bumping part to reduce the noise.

Figure 24A:
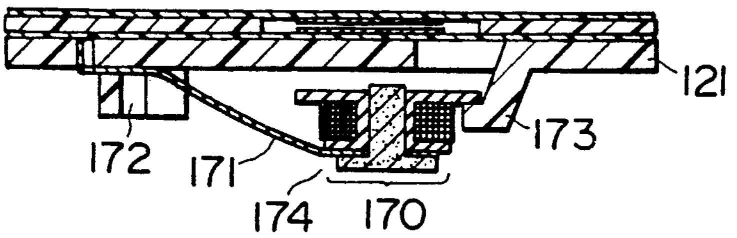
Figure 24B:
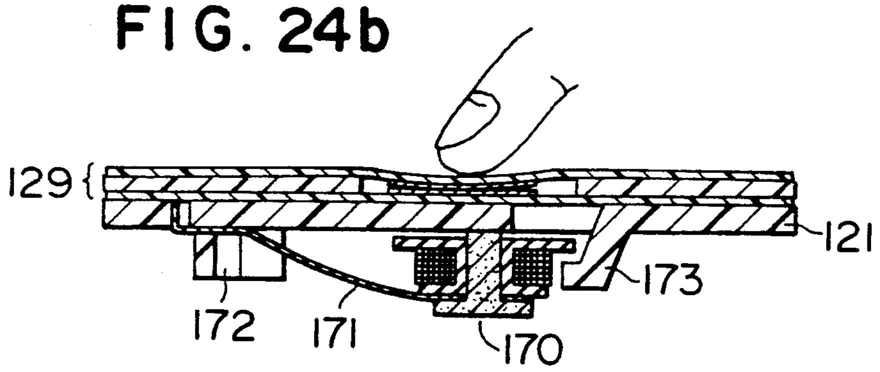

In the panel switch shown in FIGS. 24a and 24b, a leaf spring 171 secured near the tip end of a movable electromagnetic body 170 is fixed with a hook 172 formed on a substrate board 121 made of a ferromagnetic material. The movable electromagnetic body 170 is curried by another fixing hook 173 formed on the substrate board 121, so that the movement of the electromagnetic body 170 is limited within a predetermined range by the leaf spring 171. Herein, the resilient force of the leaf spring 171 is set along such a direction as to separate the electromagnetic body 170 from the substrate board 121.

A vibration unit 174 in FIGS. 24a and 24b comprises the electromagnetic body 170, the leaf spring 171 and the hooks 172, 173.

When the electromagnetic body 170 is excited, the electromagnetic body 170 comes into collision with the substrate board 121 due to a magnetic attractive force. When the excitation of the electromagnetic body 170 is interrupted, the electromagnetic body 170 comes into collision with the fixing hook 173 due to the resilient force of the leaf spring 171. This vibration unit 174 has the feature that its manufacturing cost can be reduced since the number of component parts are small.

Figure 25:
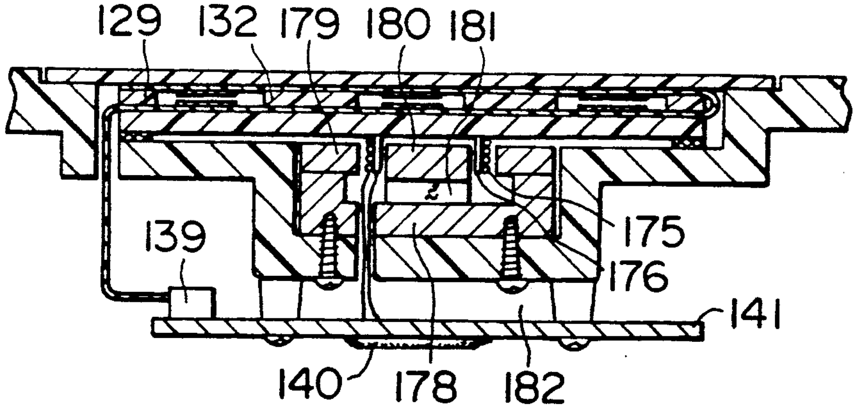

In the panel switch shown in FIG. 25, a bobbin 176 onto which a coil 175 is wound is located under a substrate board 121 for holding a membrane switch 177. A magnetic circuit of a vibration unit 182 comprises a magnetic piece 178, an outer plate 179, an inner plate 180 and a permanent magnet 181 for exerting a magnetic field onto the coil 175 along a vertical direction.

Figure 26:
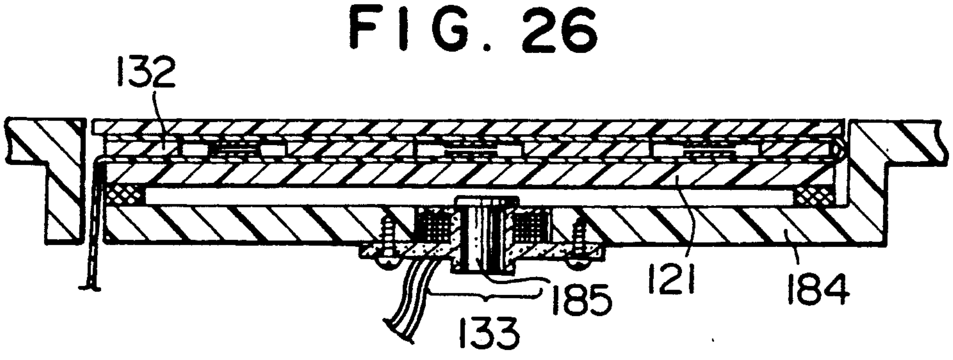

In the panel switch shown in FIG. 26, a plunger 183 is attached to a casing 184, and a rod 185 is disposed inside the plunger 183 in a state capable of upward motion. When the rod 185 comes into collision with a substrate board 121, switching feeling is provided.

Figure 27A:
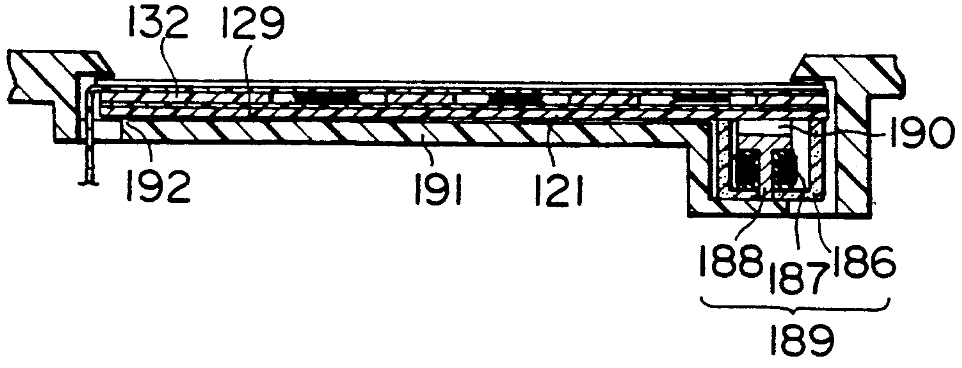
Figure 27B:
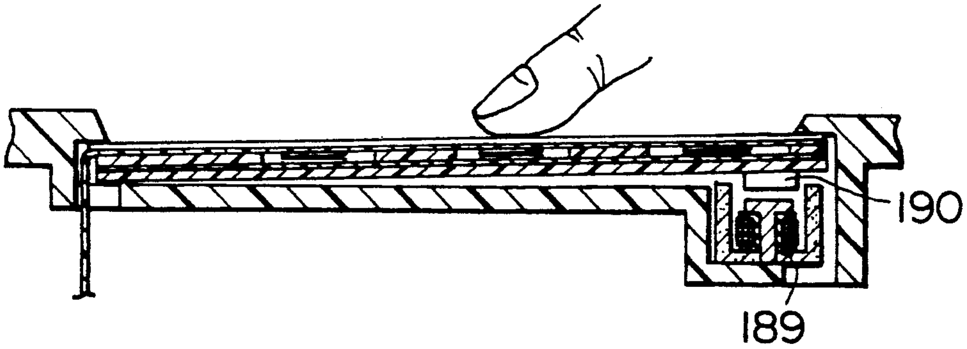

In the panel switch shown in FIGS. 27a and 27b, an electromagnetic body 189 comprises a bobbin 187 onto which a coil 186 is wound and a magnetic piece 188. A permanent magnet 190 is located at a position facing to the magnetic piece 188. When the electromagnetic body 189 is excited or the excitation is interrupted, a magnetic repelling or attractive force is generated between the electromagnetic body 189 and the permanent magnet 190. In response to this magnetic forces a substrate board 121 swings downwards or upwards about a projection 192 formed on a casing 191 as a fulcrum, so as to provide switching feeling.

In a stationary state, the permanent magnet 190 is magnetically attracted to the magnetic piece 188 as shown in FIG. 27a. When a membrane switch 129 is turned on, the electromagnetic body is excited in a manner such that its inside is charged with N polarity while its outside with S polarity. Thereby, a magnetic repelling forced is exerted on the permanent magnet 190 to push up the substrate board 121. Thus, the switching feeling is provided.

Figure 28:
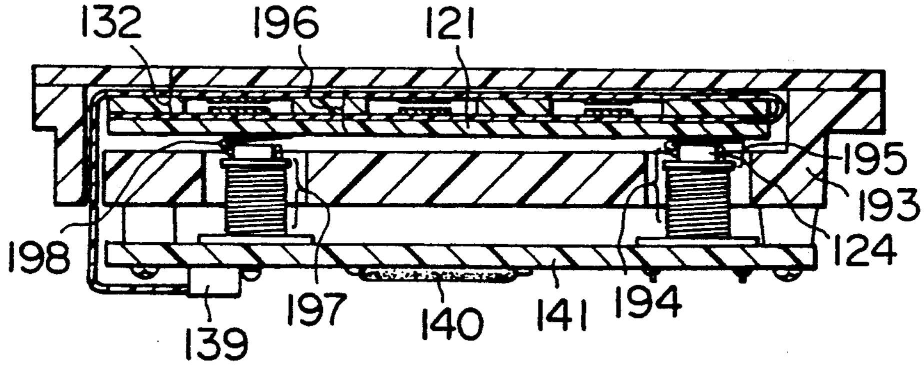

In the panel switch shown in FIG. 28, electromagnetic bodies 194, 197 are mounted on a substrate board 141 fixed to a casing 193. Another substrate board 121 made of a ferromagnetic material equipped with a membrane switch 196 is disposed on the electromagnetic bodies 194, 197 through springs 195, 198.

In a stationary state, the substrate board 121 is pushed up by the resilient force of the springs 195, 198. When the membrane switch 196 is turned on, the electromagnetic bodies 194, 197 are excited so that the substrate board 121 is pulled downwards to provide switching feeling. When the excitation of the electromagnetic bodies 194, 197 is interrupted, the substrate board 121 is returned to its original position by the return motion of the springs 195, 198.

FIGS. 29*a*–38 show other examples of the present invention. FIGS. 29*a*–29*c* are sectional views of an input device with a two-step switch. FIG. 30 is a sectional view of an input device using a motor. FIG. 31 is a sectional view of an input device using a panel switch with knobs. FIG. 32 is a sectional view of an input device using a water-proof lighting panel switch. FIG. 33 is a sectional view of an input device using a transparent panel switch. FIG. 34 is a sectional view of an input device using a lighting membrane switch. FIGS. 35*a* and 35*b* are sectional views of an input device using a covered panel switch. FIGS. 36*a* and 36*b* are sectional views of another input device using a covered panel switch. FIG. 37 is a sectional view of an input device using a tablet for a position detector. FIG. 38 is a sectional view of another input device using a panel switch.

In the input device shown in FIGS. 29*a*–29*c*, a first switch 201 comprises a first movable contact 199 and a second movable contact 200 while a second switch 202 comprises a third movable contact 202 and a fixed contact 203. The switches 201, 202 are assembled to form a two-step switch. These members are held on an insulating substrate board 205, and a vibration unit 206 is fixed to the back side of the substrate board 205.

When the first switch 201 is turned on is shown in FIG. 29*b*, the vibration unit 206 is actuated one time. When the second switch 204 is turned on as shown in FIG. 29*c*, the vibration unit 206 is actuated again. Thus, switching feeling is provided on each stage when each of the first and second switches 201, 204 is tuned on. Herein, switches may be disposed in three steps or more. Switching feeling on each stage may be optionally adjusted by controlling the number of actuation and/or the actuating time of the vibration unit with the use of a proper control unit (not shown).

In the input device shown in FIG. 30, a vibration unit 207 comprises a motor 208, a cam 209 and a leaf spring 210. The leaf spring 210 is bent by the cam 209 attached to a shaft of the motor 208 every half rotation of the motor 208. When the leaf spring 210 is disconnected from the cam 209, a substrate board 121 or the cam 209 is locked by the return motion of the leaf spring 210. Herein, a stepping motor may be used as the motor 208, or rotation detecting mechanism such as a photosensor may be disposed, so that controlling operation can be more easily performed every locking.

In the panel switch with knobs shown in FIG. 31, a membrane switch comprises an insulating substrate board 213 held on a casing 211 through springs 212, 218, and an upper FPC 215 disposed on the substrate board 213 through spacers 214. A vibration unit 216 is mounted on the membrane switch 213. Knobs 219 fixed to the casing 211 with hinges are disposed above movable contacts 217 of the membrane switch.

When the knob 219 is pushed down to actuate the vibration unit 216, the spring 212 reduce the transmission of vibration to the casing 211, and exhibits the effect to uniformly vibrate the insulating substrate board 213. Sponge or rubber having elasticity may be used instead of the spring 212. Since the knob 219 is connected to the casing 211 with the hinge, vibration of knobs other than the pushed-down knob is inhibited, and the downward motion of the other knobs is inhibited when the insulating substrate board 213 is shifted downwards. Hereon, the connection of the spring 212 and/or the knob 219 to the casing 211 may be omitted.

In the water-proof lighting panel switch shown in FIG. 32, a membrane switch 223 comprises a translucent insulating substrate board 220, and an upper FPC 222 disposed on the substrate board 220 through spacers 221. A knob sheet 224 equipped with a water-proof packing made of a light-permeable elastic high-molecular material such as silicone rubber is mounted on the membrane switch 223. These members are fixed with a hook 226 formed at a casing 225. Under the membrane switch 223, there is disposed a printed circuit board 230 on which an electromagnetic body 228 with a locking element 227 and light emitting elements 229 are attached.

In the transparent panel switch shown in FIG. 33, a vibration unit 234 is mounted through a damper 233 on a printed circuit board 232 to which a display element 231 is attached. On the vibration unit 234, there is disposed a transparent insulating board 237 made of reinforced glass or the like. Transparent fixed contacts 235 and dot spacers 236 are formed on the substrate board 237. Transparent movable contacts 238 are attached to the lower surface of a transparent elastic sheet 239. The Periphery of the transparent elastic sheet 239 is stuck on the substrate board 237 with a spacer 240 having viscous layers on its both surfaces.

The transparent panel switch in FIG. 33 is explained as a contact type, but a photosensitive switch using a light emitting diode and a photo receiving element may be used. In this case, the transparent fixed contacts 235 and the dot spacers 236 on the transparent insulating substrate board 237 and the transparent elastic sheet 239 are omitted. Owing to this structure, switching feeling can be applied to the transparent panel switch which can not provide switching feeling in prior arts.

In the lighting membrane switch shown in FIG. 34, light emitting elements 242 and a damper 243 are mounted on a printed circuit board 241, and a vibration unit 244 is mounted through the damper 243 on the printed circuit board 241. Above the printed circuit board 241, there is disposed a transparent insulating substrate board 246 having one end held with the vibration unit 244 and the other end held with a damper 243 attached to a casing 245. A membrane switch 247 and a panel 248 having a light-permeable display are further arranged above the substrate board 246.

In the covered panel switch shown in FIGS. 35*a* and 35*b*, a plunger 251 is mounted on a printed circuit board 253 received in a main casing 252, in a manner such that a rod 250 is located at a position facing to a part of a cover 249 when the cover 249 is opened as shown in FIG. 35*a*. When a switch 254 is turned on as shown in FIG. 35*b*, the rod 250 extending from the plunger 251 comes into contact with the cover 249 and transmits vibration to the cover 249.

Figure 36A:
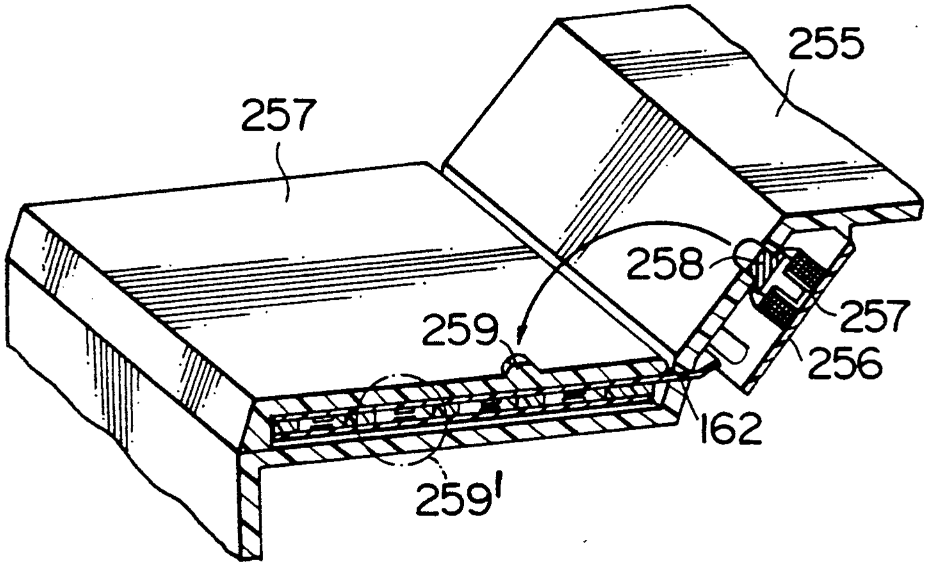
FIGS. 36a and 36b are sectional views for explaining another example applied to the same AV equipment.
Figure 36B:
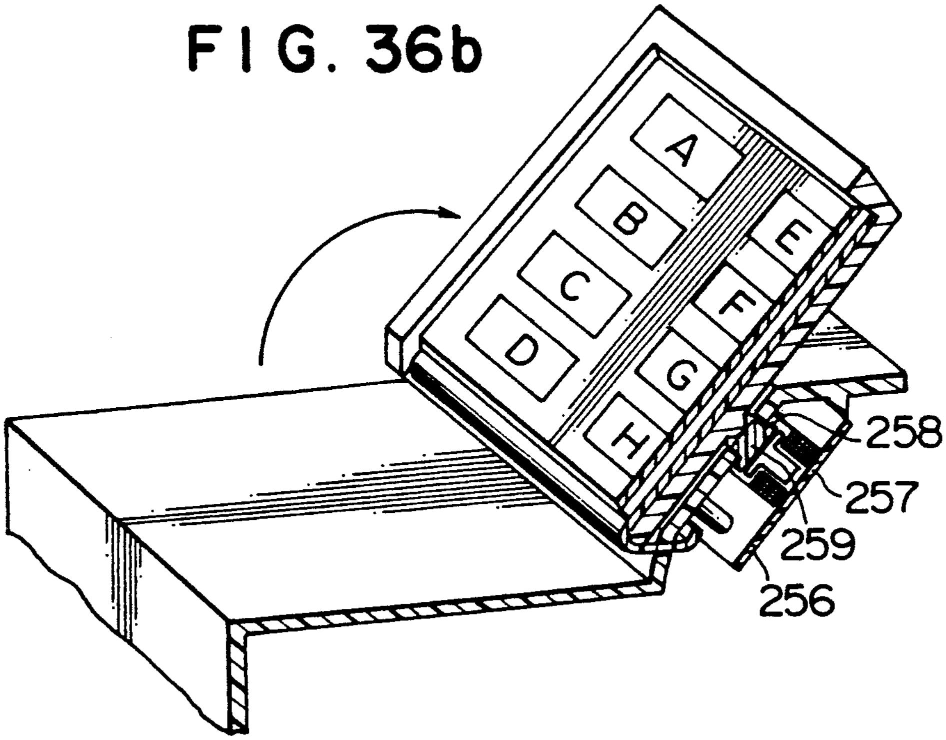

In the other covered panel switch shown in FIGS. 36*a* and 36*b*, a vibration unit 257 is mounted on a printed circuit board 256 received in a main casing 255. A vibration transmitting element 258 capable of freely vibrating is located at an opening of the main casing 255 above the vibration unit 257. A pushing projection 259, which comes in contact with the vibration transmitting element 258 when a cover 257' is opened, is formed at the back side of the cover 257'.

When a switch 259' is turned on as shown in FIG. 36b, the vibration unit 257 is actuated, and the resulting vibration is transmitted as switching feeling through the vibration transmitting element 258 and the pushing projection 259 to the switch 259'.

In the position detector tablet shown in FIG. 37, an X-Y detector switch 267 comprises a lower FPC 261 having a lower resistor 261 and dot spacers 262 mounted on a main casing 260, an upper resistor 264 located at a position facing to the lower resistor 261 in a predetermined distance through the dot spacers 262, an upper FPC 265 for holding the upper resistor 264, and a design panel 266 to which a predetermined switch pattern is applied. A vibration unit 268 is fixed to the lower surface of the main casing 260 with hooks 260' formed in a unitary body with the main casing 260.

A printed circuit board 269, on which an X-Y detector circuit and a control circuit for the vibration unit 268 are formed, is fixed to the lower side of the main casing 260 with screws 270. Owing to the constitution afore-mentioned, switching feeling is applied to the position detector tablet which can not connectionally provide switching feeling in prior arts.

In the other input device shown in FIG. 38, a printed circuit board 275, on which fixed contacts 273, 274 are formed at positions adjacent to each other, is mounted on a casing 271 through hinge dampers 272 formed in a unitary body with the casing 271. A design panel 278 is mounted on the printed circuit board 275. In the design panel 278 there are formed bulgings 276, movable contacts 277 being attached to the inner surface of the bulgings 276. A vibration unit 279 and electronic parts 277 such as a control unit are integrally attached to the lower surface of the printed circuit board 275. Owing to this structure, the number of parts are reduced, and the panel switch providing switching feeling can be offered at a low cost.

As for the control unit, its explanation is partially omitted in some of the examples. This control unit may be optionally attached to the printed circuit board or disposed separately from the printed circuit board.

According to the present invention, overcoming the problems afore-mentioned, a panel switch comprises a switching unit which is equipped with less click mechanisms or click means which actuated when one of switches in the switching unit is turned on. Therefore, the following advantages are obtained.

(1) Since the switching unit does not use a diaphragm, it is possible to reduce a space occupied by the switching unit while enabling the optional arrangement of knobs at one's discretion. Consequently, the degree of freedom on the design is enlarged, and a small-sized panel switch with small switch pitch having switching feeling can be offered.

(2) Switching feeling can be adjusted at one's discretion.

What is claimed is:

1. A panel switch comprising:

a switch unit including a plurality of switches arranged on a stationary substrate board through which a shock or vibration is transmitted to an operator who operates any one of said plurality of switches so as to give an input through said switch unit;

a vibration unit for applying a shock or vibration to said substrate board;

a control circuit for detecting said input by the operator, for controlling said vibration unit so as to excite the vibration unit in accordance with said input.

2. A panel switch as set forth in claim 1, wherein said substrate board has a lower side and is made of a ferromagnetic material selected from a group consisting of iron, stainless steel and plastic containing therein a magnetic material, and said vibration unit is composed of a coil and a ferromagnetic rod held in said coil so that said ferromagnetic rod is moved to and from the lower side of said substrate board when said ferromagnetic rod is magnetized and demagnetized by said control circuit through said coil.

3. A panel switch as set forth in claim 1, wherein said vibration unit is composed of a movable bobbin having at least a center hole formed therein and wound thereon with a coil, and a holder slidably holding said movable bobbin and having one end making contact directly with the substrate board of said switch unit and the other end attached with a magnet.

4. A panel switch as set forth in claim 1, wherein said substrate board is made of ferromagnetic materials, and said vibration unit is composed of an electrical magnet having N and S magnetic poles which face said substrate board, and a holding cover attached to said switch unit and holding said electrical magnet so as to allow said electrical magnet to move to and from said substrate board.

5. A panel switch as set forth in claim 1, wherein said vibration unit is composed of at least an electromagnet attached to said switch unit and including a stationary magnetic pole piece having one and the other end, a movable magnetic pole piece having one end pivotally attached to said one end of said stationary magnetic pole piece and the other end which is a free end adapted to engage with and disengage from the other end of said stationary magnetic pole piece when said movable magnetic pole piece swings about said one end as a fulcrum, and a spring urging the other end of said movable magnetic pole piece to be away from the other end of said stationary magnetic pole piece.

6. A panel switch as set forth in claim 1, wherein said vibration unit is composed of a movable magnetic pole piece rotatably supported to said substrate board, a spring disposed between said movable magnetic pole piece and said substrate board so as to urge said movable magnetic pole piece toward said substrate board, and a magnetic pole piece for moving said movable magnetic pole piece from said substrate when an electromagnet is energized.

7. A panel switch as set forth in claim 1, wherein said substrate board is made of ferromagnetic materials, and said vibration unit is composed of a spring member having one end attached to said substrate board and the other end urged away from said substrate board, a stopper holding the other end of said spring member with a predetermined space from said substrate board and an electromagnet attached to said spring in the vicinity of the other end thereof.

8. A panel switch as set forth in claim 1, wherein said substrate board has a lower surface, and said vibration unit is composed of a bobbin having a hollow inside and wound thereon with a coil and provided on said lower surface of said substrate board, a magnetic pole piece arranged so as to surround said coil, a plate disposed in the hollow inside of said bobbin, a permanent magnet attached to said magnetic pole piece, and carrying said plate for applying a magnetic field to said coil.

9. A panel switch as set forth in claim 1 wherein said vibration unit is composed of a plunger having a movable rod adapted to bump against said substrate board.

10. A panel switch as set forth in claim 1, further comprising a housing, wherein said vibration unit is composed of an electromagnet mounted to said housing, said substrate board which is rotatable about one end thereof as a fulcrum, and a permanent magnet mounted on said substrate board and normally attracted by said electromagnet, for replusing said electromagnet when the latter is energized.

11. A panel switch as set forth in claim 1, wherein said substrate board is made of ferromagnetic materials, and said vibration unit is composed of an electromagnet provided to said substrate board through the intermediary of a spring.

12. A panel switch as set forth in claim 1, wherein said switch unit is a multi-stage switch provided on said substrate board and adapted to be switched multistagely by a pressing force.

13. A panel switch as set forth in claim 1, wherein said vibration unit is composed of a motor mounted on said substrate board, a cam attached to said motor, a leaf spring having one end attached to said substrate board and the other end engaged with said cam so that the other end of said leaf spring strikes upon said cam when said cam comes off from said leaf spring.

14. A panel switch as set forth in claim 1, further comprising a housing, wherein said switch unit is composed of a membrane switch and a button mounted on said casing, for driving said membrane switch, and said vibration unit is mounted on said membrane switch.

15. A panel switch as set forth in claim 1, wherein said substrate board is transparent, said switch unit is composed of a light-transmitting membrane switch arranged on said transparent substrate board and having a lower side on which said transparent substrate board is laid and a lower part, and said vibration unit is composed of a key disposed in the lower part of said membrane switch, for striking said transparent substrate board, an electromagnet for driving said key, and a printed circuit board arranged on the lower side of said membrane switch and carrying thereon said electromagnet and a light emitting element.

16. A panel switch as set forth in claim 1, wherein said vibration unit is arranged on a printed circuit board having a display element, through the intermediary of a damper, and at least one switch panel having a transparent insulating substrate is provided on said vibration unit.

17. A panel switch as set forth in claim 1, wherein said vibration unit is disposed on a printed circuit board, having a light emmitting element through the intermediary of a damper, and at least one switch panel having a transparent insulating substrate is provided on said vibration unit.

18. A panel switch as set forth in claim 1, further including a cover hinged to an apparatus body, for opening and closing said apparatus body, wherein said switch unit is disposed in said cover while said vibration unit includes a movable part and is disposed in said apparatus body at a position where said movable part makes contact with said cover when said cover is opened or closed.

19. A panel switch as set forth in claim 1, further including a cover hinged to an appartus body, for opening and closing said apparatus body and having a front surface and a rear surface on which a pushing projection is formed, wherein said switch unit is disposed on the front surface of said cover, said vibration unit transmits vibration to said pushing projection through a vibration transmitting element which abuts against said pushing projection when said cover is opened.

20. A panel switch as set forth in claim 1, wherein said switch unit is composed of a position detecting tablet comprising at least upper and lower resistors, and dot spacers disposed therebetween.

21. A panel switch as set forth in claim 1, wherein said control circuit delivers a drive signal for controlling a shock and vibration to said vibration unit.

22. A panel switch as set forth in claim 1, wherein said switch unit comprises a transparent touch panel underneath which said switches are arranged, and said substrate board is transparent.

23. A panel switch as set forth in claim 1, wherein said vibration unit is composed of a movable bobbin having at least a center hole formed therein and wound thereon with a coil, and a holder slidably holding said movable bobbin and having one end making contact indirectly with the substrate board of said switch unit and the other end attached with a magnet.

24. A panel switch as set forth in claim 9, wherein said plunger has a silencer member through which said movable rod bumps against said substrate board.

25. A panel switch as set forth in claim 2, wherein said rod is urged away from said substrte board by means of a spring.

26. A panel switch as set forth in claim 2, wherein said vibration unit includes a silencer member through which said rod bumps upon said substrate board, whereby a bumping sound, generated by said rod bumping upon said substrate board, is reduced.

* * * * *